(12) United States Patent
Wang et al.

(10) Patent No.: US 8,216,436 B2
(45) Date of Patent: Jul. 10, 2012

(54) HETERO-NANOSTRUCTURES FOR SOLAR ENERGY CONVERSIONS AND METHODS OF FABRICATING SAME

(75) Inventors: Dunwei Wang, Newton Highlands, MA (US); Yongjing Lin, Chestnut Hill, MA (US)

(73) Assignee: The Trustees of Boston College, Chestnut Hill, MA (US)

( * ) Notice: Subject to any disclaimer, the term of this patent is extended or adjusted under 35 U.S.C. 154(b) by 424 days.

(21) Appl. No.: 12/546,828

(22) Filed: Aug. 25, 2009

(65) Prior Publication Data

US 2010/0043877 A1    Feb. 25, 2010

Related U.S. Application Data

(60) Provisional application No. 61/091,570, filed on Aug. 25, 2008, provisional application No. 61/119,470, filed on Dec. 3, 2008.

(51) Int. Cl.
*C25B 1/04* (2006.01)
*C25B 11/04* (2006.01)
*C25B 11/06* (2006.01)

(52) U.S. Cl. .............. 204/248; 204/252; 204/290.12; 204/291; 205/340; 205/627; 205/630

(58) Field of Classification Search .................. None
See application file for complete search history.

(56) References Cited

U.S. PATENT DOCUMENTS

| | | | |
|---|---|---|---|
| 4,957,777 A | 9/1990 | Ilderem et al. | |
| 6,113,983 A | 9/2000 | Zachariah et al. | 427/253 |
| 6,361,660 B1 | 3/2002 | Goldstein | 204/157.15 |
| 6,482,476 B1 | 11/2002 | Liu | 427/535 |
| 6,518,156 B1 | 2/2003 | Chen et al. | 438/597 |
| 6,592,842 B2 | 7/2003 | Elder et al. | 423/610 |
| 6,656,573 B2 | 12/2003 | Chen et al. | 428/195 |

(Continued)

FOREIGN PATENT DOCUMENTS

CN    1822331 A    8/2006

(Continued)

OTHER PUBLICATIONS

Banerjee et al, Synthesis of Coupled Semiconductor by Filling 1D TiO2 Nanotubes with CdS, Chemical and Materials Engineering, vol. 20, No. 21, Oct. 22, 2008, pp. 6784-6791.*

(Continued)

*Primary Examiner* — Harry D Wilkins, III
(74) *Attorney, Agent, or Firm* — Greenberg Traurig, LLP; David J. Dykeman; Danielle T. Abramson

(57) ABSTRACT

The embodiments disclosed herein relate to hetero-nanostructures for efficient solar energy conversions, and more particularly to the fabrication of titanium dioxide hetero-nanostructures and methods of using same for water splitting. In an embodiment, a hetero-nanostructure includes a plurality of connected and spaced-apart nanobeams linked together at an about 90-degree angle, the plurality of nanobeams including a conductive silicide core having an n-type photoactive titanium dioxide shell. In an embodiment, a device for splitting water to generate hydrogen and oxygen includes a first compartment two-dimensional hetero-nanostructure having a plurality of connected and spaced-apart nanobeams, each nanobeam substantially perpendicular to another nanobeam, the plurality of nanobeams including an n-type photoactive titanium dioxide shell having a highly conductive core; and a second compartment copper-doped titanium dioxide nanostructure, wherein the first compartment and the second compartment are separated by a semi-permeable membrane.

20 Claims, 12 Drawing Sheets

U.S. PATENT DOCUMENTS

| | | | | |
|---|---|---|---|---|
| 6,770,337 | B2 | 8/2004 | Debe et al. | 428/32.6 |
| 6,855,025 | B2 | 2/2005 | Iwasaki et al. | 445/24 |
| 7,235,471 | B2 | 6/2007 | Jawarani et al. | 438/581 |
| 7,485,799 | B2 | 2/2009 | Guerra | 136/245 |
| 8,043,942 | B2 * | 10/2011 | Lee et al. | 438/478 |
| 2002/0167256 | A1 | 11/2002 | Iwasaki et al. | 313/309 |
| 2003/0138555 | A1 | 7/2003 | Debe et al. | 427/152 |
| 2003/0228727 | A1 | 12/2003 | Guerra | 438/200 |
| 2005/0051439 | A1 | 3/2005 | Jang | 205/639 |
| 2005/0277275 | A1 | 12/2005 | Jawarani et al. | 438/581 |
| 2006/0046480 | A1 | 3/2006 | Guo | |
| 2007/0222013 | A1 | 9/2007 | Lincoln et al. | 257/431 |
| 2007/0275160 | A1 | 11/2007 | Maldonado et al. | 427/122 |
| 2008/0087998 | A1 | 4/2008 | Kamins et al. | 257/686 |
| 2008/0223713 | A1 | 9/2008 | Xu et al. | 204/157.15 |
| 2009/0117741 | A1 * | 5/2009 | Heath et al. | 438/694 |
| 2009/0183994 | A1 * | 7/2009 | Misra et al. | 205/340 |
| 2010/0044072 | A1 | 2/2010 | Wang et al. | 174/126.1 |
| 2010/0327258 | A1 * | 12/2010 | Lee et al. | 257/14 |

FOREIGN PATENT DOCUMENTS

| | | |
|---|---|---|
| CN | 1843998 A | 10/2006 |
| CN | 1872662 A | 12/2006 |
| JP | 07254574 A | 10/1995 |
| WO | WO 2005/113859 A2 | 12/2005 |
| WO | WO 2006/010926 A1 | 2/2006 |
| WO | WO 2007/120466 A2 | 10/2007 |
| WO | WO 2007/143017 | 12/2007 |
| WO | WO 2008/028522 A1 | 3/2008 |
| WO | WO 2008/060293 | 5/2008 |

OTHER PUBLICATIONS

Lin et al, One-step formation of core-shell sulfide-oxide nanorod arrays from a single precursor, Nanotechnology, vol. 17, pp. 4773-4782, 2006.*

Zhang et al, Synthesis of TiO2/SiO2 Core/Shell Nanocable Arrays, Journal of Physical Chemistry B, vol. 108, pp. 14866-14869, 2004.*

Zou et al, Synthesis and electrical properties of TiSI2 nanocables, Applied Physics Letters, vol. 92, pp. 253102-1-253102-3, Jun. 23, 2008.*

Chong et al, TiO2 Nanobelts/CdSSe Quantum Dots Nanocomposite, Journal of Physical Chemistry C, vol. 111, pp. 10389-10393, 2007.*

Alexander, B.D., et al., Metal Oxide Photoanodes for Solar Hydrogen Production, *J. Mater. Chem.*, vol. 18, Issue 20, pp. 2298-2308 (May 28, 2008).

Arico, S., et al., Nanostructured Materials for Advanced Energy Conversion and Storage Devices, *Nature Materials*, vol. 4 (May 2005).

Bak, T., et al., Photo-electrochemical Properties of the TiO2-Pt System in Aqueous Solutions, *International Journal of Hydrogen Energy*, vol. 27, Iss. 1 (Nov. 15, 2001).

Becker, J.S., et al., Highly Conformal Thin Films of Tungsten Nitride Prepared by Atomic Layer Deposition from a Novel Precursor, *Chem. Mater.*, vol. 15, pp. 2969-2976 (Jun. 20, 2003).

Beyers, R., et al., Metastable Phase Formation in Titanium-Silicon Thin Films. *J. Appl. Phys.*, 57, p. 5240 (Jun. 15, 1985).

Bierman, M.J., et al., Dislocation-Driven Nanowire Growth and Eshelby Twist, *Science*, 10.1126/science 1157131 (May 23, 2008).

Bierman, M.J., et al., Hyperbranched PbS and PbSe Nanowires and the Effect of Hydrogen Gas on Their Synthesis, *Nano Lett.*, vol. 7, No. 9 p. 2907-2912 (Aug. 2, 2007).

Bolton, J., Solar Photoproduction of Hydrogen: A review, *Solar Energy*, vol. 57, Iss. 1, pp. 37-50 (Jul. 1, 1996).

Boukai, A. I., et al., Silicon Nanowires as Efficient Thermoelectric Materials, *Nature*, vol. 451, Iss. 7175, pp. 168-171 (Jan. 10, 2008).

Bragagnolo, Julio, et al., The Design and Fabrication of Thin-Film CdS/Cu2S Cells of 9.15-Percent Conversion Efficiency, IEEE Transactions on Electron Devices, vol. Ed 27, No. 4, pp. 645-651 (Apr. 1980).

Burgelman, M., et al., Theoretical Advantages of pn$^+$-Type Cu$_2$S-ZnO Solar Cell, *Electronics Letters*, vol. 17, No. 6 (Mar. 19, 1981).

Cao, Yang, et al., A Technique for Controlling the Alignment of Silver Nanowires with an Electric Field, *Nanotechnology*, vol. 17, pp. 2378-2380 (Apr. 11, 2006).

Chan, Candace K., et al., High-Performance Lithium Battery Anodes Using Silicon Nanowires, *Nature Nanotechnology*, vol. 3, pp. 31-35 (Dec. 16, 2007).

Chen, J. et al., Comparison of TiSi$_2$, CoSi$_2$, and NiSi for Thin-Film Silicon-on-Insulator Applications. *J. Electrochem. Soc*, 144, 2437 (Jul. 1997).

Chen, X. B., et al., Synthesis of Titanium Dioxide (TiO$_2$) Nanomaterials, *J. Nanosci. Nanotechnol.*, vol. 6, No. 4, pp. 906-925 (Apr. 2006).

Chueh, Yu-Lun, et al., TaSi$_2$ Nanowires: A Potential Field Emitter and Interconnect, *Nano Lett*, vol. 6, No. 8, 1637-1644 (Jul. 12, 2006).

Cui, Li-Feng, et al., Carbon-Silicon Core-Shell Nanowires as High Capacity Electrode for Lithium Ion Batteries, *Nano Lett.*, 9 (9), pp. 3370-3374 (Aug. 5, 2009).

Decker, C.A., et al., Directed Growth of Nickel Silicide Nanowires, *Appl. Phys. Lett.*, vol. 84, pp. 1389-1391 (Feb. 23, 2004).

Du, J., et al., Growth Mechanism of TiSi Nanopins on Ti$_5$Si$_3$ by Atmospheric Pressure Chemical Vapor Deposition. *Journal of Physical Chemistry C*, vol. 111, pp. 10814-10817 (Jul. 4, 2007).

Ekman, M., et al., Electronic Structure and Bonding Properties of Titanium Silicides. *Phys. Rev. B: Condens. Matter*, vol. 57, p. 4419 (Feb. 15, 1998).

Fan, Zhiyong, et al., Three-Dimensional Nanopillar-Array Photovoltaic on Low-Cost and Flexible Substrates, *Nature Materials*, vol. 8, pp. 648-653 (Aug. 2009).

Gao, P., et al., Self-Assembled Nanowire-Nanoribbon Junction Arrays of ZnO. *J. Phys. Chem. B*, vol. 106, pp. 12653-12658 (Nov. 12, 2002).

Garnett, E.C., Silicon Nanowire Radial p—n Junction Solar Cells, *J. Am. Chem. Soc.*, vol. 130 (29), pp. 9224-9225 (Jun. 25, 2008).

Ghicov, A., et al., Lattice Widening in Niobium-Doped TiO$_2$ Nanotubes: Efficient Ion Intercalation and Swift, *Angew. Chem. Int. Ed.*, vol. 47, Iss. 41, pp. 7934-7937 (Sep. 9, 2008).

Givargizov, E.I., Fundamental Aspects of VLS Growth, *J. Cryst. Growth* vol. 31, pp. 20-30 (Dec. 1975).

Goodey, A.P., et al., Silicon Nanowire Array Photoelectrochemical Cells, *J. Am. Chem. Soc.*, vol. 129, pp. 12344-12345 (Sep. 25, 2007).

Graetz, J., et al., Highly Reversible Lithium Storage in Nanostructured Silicon, *Electrochem Solid State Lett.*, vol. 6, Issue 9, pp. A194-A197 (Jul. 3, 2003).

Gratzel, M., Photoelectrochemical Cells, *Nature*, vol. 414, pp. 338-344 (Nov. 15, 2001).

Grimes, C.A., et al., Synthesis and Application of Highly Ordered Arrays of TiO2 Nanotubes, *J. Mater. Chem.*, vol. 17, Issue 15, pp. 1451-1457 (Apr. 21, 2007).

Gur, I., et al., Hybrid Solar Cells with Prescribed Nanoscale Morphologies Based on Hyperbranched Semiconductor Nanocrystals. *Nano Lett.*, vol. 7, pp. 409-414 (Dec. 29, 2006).

Hatchard, T.D., in Situ XRD and Electrochemical Study of the Reaction of Lithium with Amorphous Silicon, *Journal of The Electrochemical Society*, 151 (6) pp. A838-A842 (Apr. 30, 2004).

Hirahara, Eiji, The Electrical Conductivity and Isothermal Hall Effect in Cuprous Sulfide, Semi-Conductor, *Journal of the Physical Society of Japan*, vol. 6, No. 6, (Nov. 1951).

Hochbaum, Allon I., et al., Enhanced Thermoelectric Performance of Rough Silicon Nanowires, *Nature*, vol. 451, pp. 163-168 (Jan. 10, 2008).

Holmes, Justin D., Control of Thickness an Orientation of Solution-Grown Silicon Nanowires, *Science*, vol. 287, pp. 1471-1473 (Feb. 25, 2000).

Iannuzzi, M. et al., Surface Energies and Surface Relaxation at TiSi$_2$ Competing Phases, *Surface Science*, vol. 479, pp. 201-212 (May 20, 2001).

Jeon, H., et al., Morphology and Phase Stability of TiSi$_2$ *J. Appl. Phys.* 71 (9), p. 4269 (May 1, 1992).

Kanaras, A.G., et al., Controlled synthesis of hyperbranched inorganic nanocrystals with rich three-dimensional structures. *Nano Lett.*, vol. 5, No. 11, pp. 2164-2167 (Oct. 19, 2005).

Kang, Kibum, et al., The Role of $NiO_x$ Overlayers on Spontaneous Growth of $NiSi_x$ Nanowires from Ni Seed Layers, *Nano Letters*, vol. 8, No. 2, pp. 431-436 (Feb. 2008).

Kasavajjula, Uday, et al., Nano- and Bulk-Silicon-Based Insertion Anodes for Lithium-Ion Secondary Cells, *Journal of Power Sources*, 163, pp. 1003-1039 (Nov. 19, 2006).

Kayes, Brendan M., Comparison of the Device Physics Principles of Planar and Radial P-N Junction Nanorod Solar Cells, *Journal of Applied Physics* 97, Issue 11, p. 114302, (May 23, 2005).

Kim, C-J., et al., Spontaneous Chemical Vapor Growth of NiSi Nanowires and Their Metallic Properties. *Adv. Mater.*, vol. 19 (21), pp. 3637-3642 (Oct. 16, 2007).

Kim, H., et al., Superior Lithium Electroactive Mesoporous Si@Carbon Core-Shell Nanowires for Lithium Battery Anode Material, *Nano Letters*, vol. 8, No. 11, pp. 3688-3691 (Oct. 24, 2008).

Koncki, Robert, et al., Screen-Printed Copper Ion-Selective Electrodes, *Fresenius J. Anal. Chem.*, vol. 367, No. 4, pp. 393-395 (Jun. 2000).

Lao, J.Y., et al., Hierarchical ZnO Nanostructures. *Nano Lett.*, vol. 2, No. 11, pp. 1287-1291 (Sep. 13, 2002).

Law, Matt, et al., Nanowire Dye-Sensitized Solar Cells, *Nature Materials*, vol. 4, pp. 455-459 (Jun. 2005).

Lewis, N., et al., Powering the Planet: Chemical Challenges in Solar Energy Utilization, *Proc. Natl. Acad. Sci. U.S.A.*, vol. 103, No. 43, pp. 15729-15735 (Oct. 16, 2006).

Li, Hong, et al., A High Capacity Nano-Si Composite Anode Material for Lithium Rechargeable Batteries, *Electrochemical and Solid-State Letters*, 2 (11) pp. 547-549 (Sep. 1, 1999).

Li, K., et al., Identification of Refractory-Metal-Free C40 $TiSi2$ for Low Temperature C54 $TiSi_2$ Formation, *App. Phys. Lett.* vol. 78, pp. 3989 (Jun. 18, 2001).

Libbrecht, Kenneth G., The Physics of Snow Crystals. *Rep. Prog. Phys.* 68, p. 855 (Mar. 8, 2005).

Lieber, C.M., Nanoscale Science and Technology: Building a Big Future from Small Things. *MRS Bull.* 28, p. 486 (Jul. 2003).

Lin, H.-K., et al., ChemInform Abstract: $Ti_5Si_3$ Nanowire and Its Field Emission Property, *Chem. Mater.* vol. 20, pp. 2429-2431 (Jun. 13, 2008).

Lin, Y., et al., $TiO_2/TiSi_2$ Heterostructures for High-Efficiency Photoelectrochemical $H_2O$ Splitting, J. Am. Chem. Soc., vol. 131, pp. 2772-2773 (Feb. 11, 2009).

Liu, Guangming, et al., Interface Properties and Band Alignment of $Cu_2S/CdS$ Thin Film Solar Cells, *Thin Solid Films*, vols. 431-432, pp. 477-482 (May 1, 2003).

Lukashev, Pavel, et al., Electronic and Crystal Structure of $Cu_2$-xS: Full-Potential Electronic Structure Calculations, *The American Physical Society, Physical Review* B, vol. 76, p. 195202 (Nov. 2, 2007).

Maiolo, J.R., High Aspect Ratio Silicon Wire Array Photoelectrochemical Cells, *J. Am. Chem. Soc.*, 129 (41), pp. 12346-12347 (Sep. 25, 2007).

Manna, L., et al., Controlled Growth of Tetrapod-Branched Inorganic Nanocrystals. *Nat Mater*, vol. 2, pp. 382-385 (May 30, 2003).

Maranchi, J.P., et al., High Capacity, Reversible Silicon Thin-Film Anodes for Lithium-Ion Batteries, *Electrochemical and Solid-State Letters*, vol. 6, Issue 9, A198-A201 (Jul. 15, 2003).

Meinardi, F., et al., Micro-Raman Study of the Factors Limiting the $TiSi_2$ C54 Phase Formation in Submicron Patterns. *Europhys. Lett.* 44 (1) pp. 57-61 (Oct. 1, 1998).

Mor, G., et al., p-Type Cu-Ti-O Nanotube Arrays and Their Use in Self-Biased Heterojunction Photoelectrochemical Diodes for Hydrogen Generation, *Nano Lett.*, vol. 8, No. 7, pp. 1906-1911 (Jun. 10, 2008).

Morita, Tomokazu, et al., Nano Si Cluster-$SiO_x$-C Composite Material as High-Capacity Anode Material for Rechargeable Lithium Batteries, *Journal of the Electrochemical Society*, 153 (2) A425-A430, (Jan. 6, 2006).

Murarka, S. P. et al., Refractory Silicides of Titanium and Tantalum for Low-Resistivity Gates and Interconnects. *IEEE Trans. on Electron Devices*, vol. ED-27, No. 8, pp. 1409-1417 (Aug. 1980).

Ohara, Shigeki, et al., Li Insertion/Extraction Reaction at a Si Film Evaporated on a Ni Foil, *Journal of Power Sources*, vols. 119-121, pp. 591-596 (Jun. 1, 2003).

O'Regan, B., et al., A Low-Cost, High-Efficiency Solar Cell Based on Dye-Sensitized Colloidal $TiO_2$ Films, *Nature*, vol. 353, pp. 737-740 (Oct. 24, 1991).

Pan, Z. W., et al, Nanobelts of Semiconducting Oxides, *Science*, vol. 291, p. 1947 (Mar. 9, 2001).

Park, J.H., et al. , Photoelectrochemical Water Splitting at Titanium Dioxide Nanotubes Coated with Tungsten Trioxide, *Appl. Phys. Lett.*, vol. 89, p. 163106 (Oct. 16, 2006).

Partain, L.D., Degradation of a $Cu_xS/CdS$ Solar Cell in Hot, Moist Air and Recovery in Hydrogen and Air, *J. Appl. Phys.*, vol. 54, No. 11, p. 6708 (Nov. 1983).

Pavasupree, S., et al., Synthesis and Dye-Sensitized Solar Cell Performance of Nanorods/Nanoparticles $TiO_2$ from High Surface Area Nanosheet $TiO_2$. *J. Nanosci. Nanotechnol.*vol. 6, No. 12, pp. 3685-3692(8) (Dec. 2006).

Peng, C.W., et al., Exposed Anatase $TiO_2$ Nanosheets. *Chem. Mater.* vol. 20, p. 2426 (Mar. 7, 2008).

Pieraggi, B., et al., Stress Generation and Vacancy Annihilation During Scale Growth Limited by Cation-Vacancy Diffusion, *Acta Metall.*, vol. 36, No. 5, pp. 1281-1289 (May 1998).

Rahtu, A., et al., Reaction Mechanism Studies on Titanium Isopropoxide-Water Atomic Layer Deposition Process, *Chemical Vapor Deposition*, vol. 8, Iss. 1, pp. 21-28 (Jan. 18, 2002).

Ritterskamp, P., et al., A Titanium Disilicide Derived Semiconducting Catalyst for Water Splitting under Solar Radiation—Reversible Storage of Oxygen and Hydrogen. *Angew. Chem. Int. Ed.*, vol. 46 (41), pp. 7770-7774 (Oct. 15, 2007).

Robertson, R., et al., Silane Pyrolysis, *Chem. Phys.Lett* . vol. 103, No. 5, pp. 397-404 (Jan. 13, 1984).

Ryu, Ji Heon, et al., Failure Modes of Silicon Powder Negative Electrode in Lithium Secondary Batteries, *Electrochemical and Solid-State Letters*, 7 (10), A306-A309 (Sep. 3, 2004).

Santato, C., et al., Photoelectrochemical Properties of Nanostructured Tungsten Trioxide Films, *J. Phys. Chem. B.*, vol. 105, pp. 936-940 (Jan. 11, 2001).

Schmitt, A.L., et al., Chemical Synthesis and Magnetotransport of Magnetic Semiconducting $Fe_{1-x}Co_xSi$ Alloy Nanowires, *Nano Lett.*, vol. 8 (3), pp. 810-815 (Feb. 1, 2008).

Schmitt, A.L. et al., Metallic Single-Crystal CoSi Nanowires via Chemical Vapor Deposition of Single-Source Precursor. *J. Phys. Chem. B*, vol. 110, pp. 18142-18146 (Aug. 26, 2006).

Schmitt, A.L. et al., Selective Patterned Growth of Silicide Nanowires Without the Use of Metal Catalysts. *Chem. Mater.*, vol. 19, pp. 126-128 (Dec. 22, 2006).

Sherman, A. Thermal CVD of Metallic Conductors, In *Chemical Vapor Deposition for Microelectronics, Principles, Technology, and Applications*; William Andrew Inc.: Norwich, NY, Chapter 4, pp. 92-118 (1987).

Shu, Jie, et al., Cage-Like Carbon Nanotubes/Si Composite as Anode Material for Lithium Ion Batteries, *Electrochemistry Communications* vol. 8, pp. 51-54 (Nov. 17, 2005).

Sigman, Michael B., Jr., et al., Solventless Synthesis of Monodisperse Cu2S Nanorods, Nanodisks, and Nanoplatelets, *J. Am. Chem. Soc.*, vol. 125, No. 51, (Dec. 24, 2003).

Song, Y.P., et al., Ultralong Single-Crystal Metallic $Ni_2Si$ Nanowires with Low Resistivity, *Nano Lett.*, vol. 7 (4), pp. 965-969 (Mar. 27, 2007).

Sullivan, John P., et al., The Effects of Varying Humidity on Copper Sulfide Film Formation, *Sand Report*, Sand2004-0670, Unlimited Release (Feb. 2004).

Szczech, J.R., et al., Single-Crystal Semiconducting Chromium Disilicide Nanowires Synthesized Via Chemical Vapor Transport. *Chem. Mater.*, vol. 19, pp. 3238-3243 (May 25, 2007).

Tada, H., et al., All Solid-State Z-Scheme in $CdS$-$Au$-$TiO_2$ Three-Component Nanojunction System, *Nat. Mater.*, Advance Online Publication, 1-5 (Sep. 10, 2006).

Takamura, Tsutomu, et al., A Vacuum Deposited Si Film Having a Li Extraction Capacity Over 2000 mAh/g With a Long Cycle Life, *Journal of Power Sources*, vol. 129, pp. 96-100 (Jan. 18, 2004).

Tarascon, J.M., et al., Issues and Challenges Facing Rechargeable Lithium Batteries, *Nature*, vol. 414, (Nov. 15, 2001).

Tian, B., et al., Coaxial Silicon Nanowires as Solar Cells and Nanoelectronic Power Sources, *Nature*, vol. 449, pp. 885-890 (Oct. 18, 2007).

Varadwaj, J.S.K., et al., Phase-Controlled Growth of Metastable Fe$_5$Si$_3$ Nanowires by a Vapor Transport Method, *J. Am. Chem. Soc.* vol. 129 (27), pp. 8594-8599 (Jun. 14, 2007).

Varghese, Oomman K., et al., Appropriate Strategies for Determining the Photoconversion Efficiency of Water Photoelectrolysis Cells: A Review with Examples Using Titania Nanotube Array Photoanodes, *Sol. Energy Mater. Sol. Cells*, vol. 92, Iss. 4, pp. 374-384, (Apr. 2008).

Varghese, Oomman K., et al., Long Vertically Aligned Titania Nanotubes on Transparent Conducting Oxide for Highly Efficient Solar Cells, *Nature Nanotechnology*, vol. 4, (Sep. 2009).

Wagner, R.S., et al., Vapor-Liquid-Solid Mechanism of Single Crystal Growth, *Applied Physics Letters*, vol. 4, No. 5, p. 89 (Mar. 1, 1964).

Wang, D., et al., Nanocrystals Branch Out. *Nat Mater.*, vol. 2, pp. 355-356 (Jun. 2003).

Wang, D., et al., Rational Growth of Branched and Hyperbranched Nanowire Structures. *Nano Lett.*, vol. 4, No. 5, pp. 871-874 (Mar. 31, 2004).

Wang, Donghai, et al., Self-Assembled TiO$_2$-Graphene Hybrid Nanostructures for Enhanced Li-Ion Insertion, *ACS Nano*, vol. 3, No. 4, pp. 907-914 (Mar. 26, 2009).

Wang, D., et al., Two-Dimensional Single-Crystal Nanowire Arrays, *Small*, vol. 3, No. 12, pp. 2043-2047 (Nov. 20, 2007).

Wang, G.X., et al., Nanostructured Si-C Composite Anodes for Lithium-Ion Batteries. *Electrochemistry Communications* 6, pp. 689-692 (Jun. 2, 2004).

Wang, Suhua, et al., Growth of Crystalline Cu2S Nanowire Arrays on Copper Surface: Effect of Copper Surface Structure, Reagent Gas Composition, and Reaction Temperature, *Chem Mater*. vol. 13, pp. 4794-4799 (Nov. 30, 2001).

Wang, T., et al., Ab Initio Comparative Study of C54 and C49 TiSi$_2$ Surfaces. *Appl. Surf. Sci.* vol. 252, p. 4943 (Sep. 8, 2005).

Wu, Y., et al., Single-Crystal Metallic Nanowires and Metal/Semiconductor Nanowire Heterostructures. *Nature*, vol. 430, pp. 61-65 (Jul. 1, 2004).

Wu, Y., et al., Synthesis and Photovoltaic Application of Copper(1) Sulfide Nanocrystals, *Nano Letters*, vol. 8, No. 8, pp. 2551-2555 (Aug. 13, 2008).

Xia, Y.N., et al., One-Dimensional Nanostructures: Synthesis, Characterization, and Applications. *Adv. Mater.*, vol. 15, No. 5, p. 353 (Mar. 4, 2003).

Xiang, B., et al., Synthesis and Field Emission Properties of TiSi$_2$ Nanowires. *Appl. Phys. Lett.*, vol. 86, p. 243103 (Jun. 7, 2005).

Yan, H., et al., Dendritic Nanowire Ultraviolet Laser Array. *J. Am. Chem. Soc.* vol. 125, pp. 4728-4729 (Mar. 29, 2003).

Yoshio, M., et al., Electrochemical Behaviors of Silicon Based Anode Material, Journal of Power Sources vol. 146 pp. 10-14 (Jun. 1, 2005).

Zhang, H.L., et al., The Facile Synthesis of Nickel Silicide Nanobelts and Nanosheets and Their Application in Electrochemical Energy Storage, *Nanotechnology*, vol. 19, 165606 (7 pp.) (Mar. 20, 2008).

Zhang, Weixin, et al., In Situ Fabrication of Inorganic Nanowire Arrays Grown from and Aligned on Metal Substrates, *Acc. Chem. Res.*, vol. 42 (10), pp. 1617-1627 (Oct. 20, 2009).

Zhao, H.Z., et al., Influence of Pressure on Silicon Nanowire Growth Kinetics, C, *J. Phys. Chem. C*, vol. 112 (15), pp. 5695-5698 (Mar. 25, 2008).

Zhou, S., et al., Rational Synthesis and Properties of Complex TiSi$_2$ Nanostructures, *Chem. Mater.*, vol. 21 (6) pp. 1023-1027 (Feb. 11, 2009).

Zhou, S., et al., Spontaneous Growth of Highly Conductive Two-Dimensional Single-Crystalline TiSi$_2$ Nanonets, *Angew. Chem. Int. Ed.* vol. 47, pp. 7681-7684 (Sep. 2, 2008).

Zhu, Kai, et al., Removing Structural Disorder from Oriented TiO$_2$ Nanotube Arrays: Reducing the Dimensionality of Transport and Recombination in Dye-Sensitized Solar Cells, *Nano Letters*, vol. 7, No. 12, pp. 3739-3746 (Nov. 6, 2007).

Bryant, W. A., "Review—The Fundamentals of Chemical Vapour Deposition", *Journal of Materials Science* 12 pp. 1285-1306 (Jul. 1977).

PCT International Search Report based on PCT/US09/054864 dated Oct. 28, 2009.

Goldfarb et al., "Scanning tunneling microscopy of titanium silicide nanoislands," *Applied Surface Science*, 238, pp. 29-35 (Jul. 2004).

Roy et al., "In situ xray diffraction analysis of the C49-C54 titanium silicide phase transformation in narrow lines," *Appl. Phys. Lett.*, 66(14), pp. 1732-1734 (Apr. 3, 1995).

\* cited by examiner

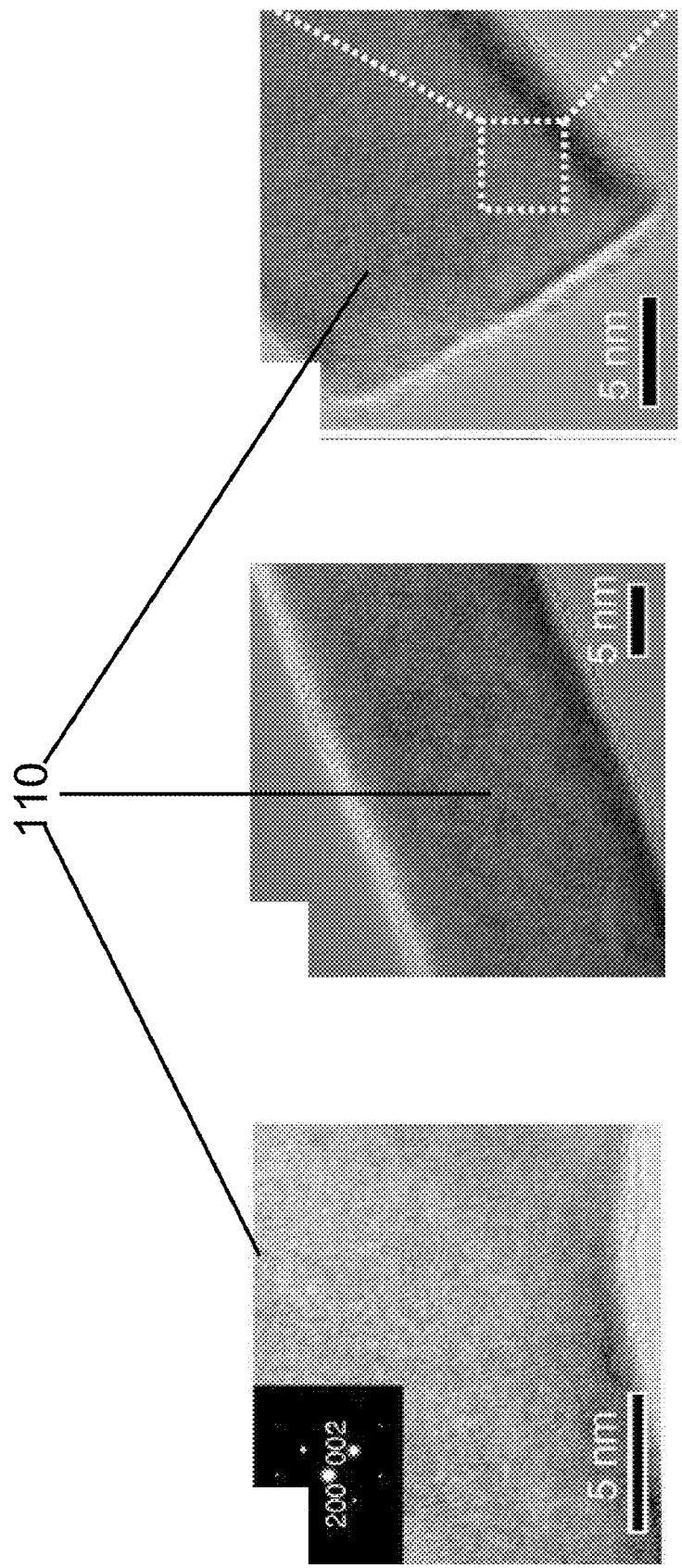

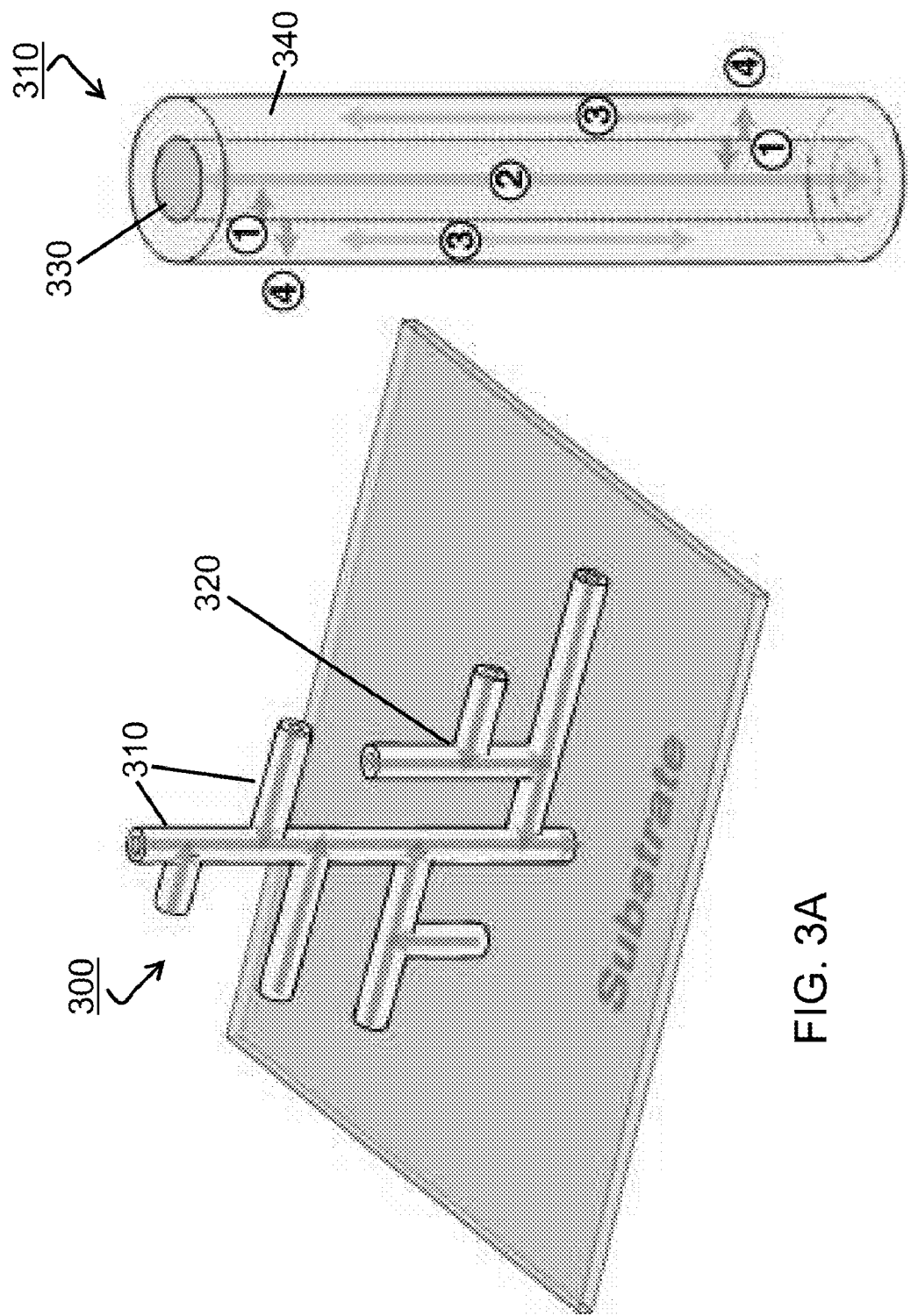

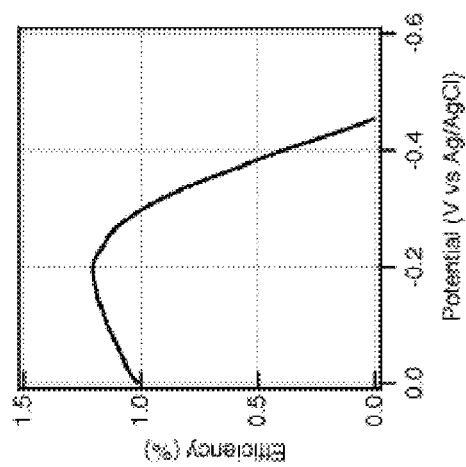
FIG. 10A
FIG. 10B
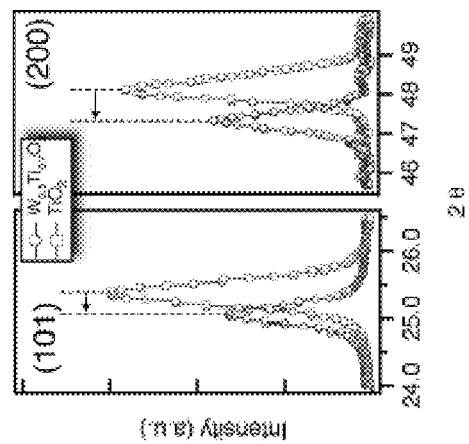
FIG. 10D
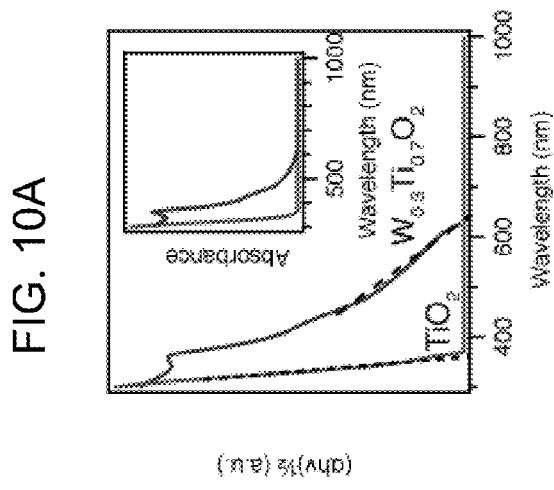
FIG. 10C

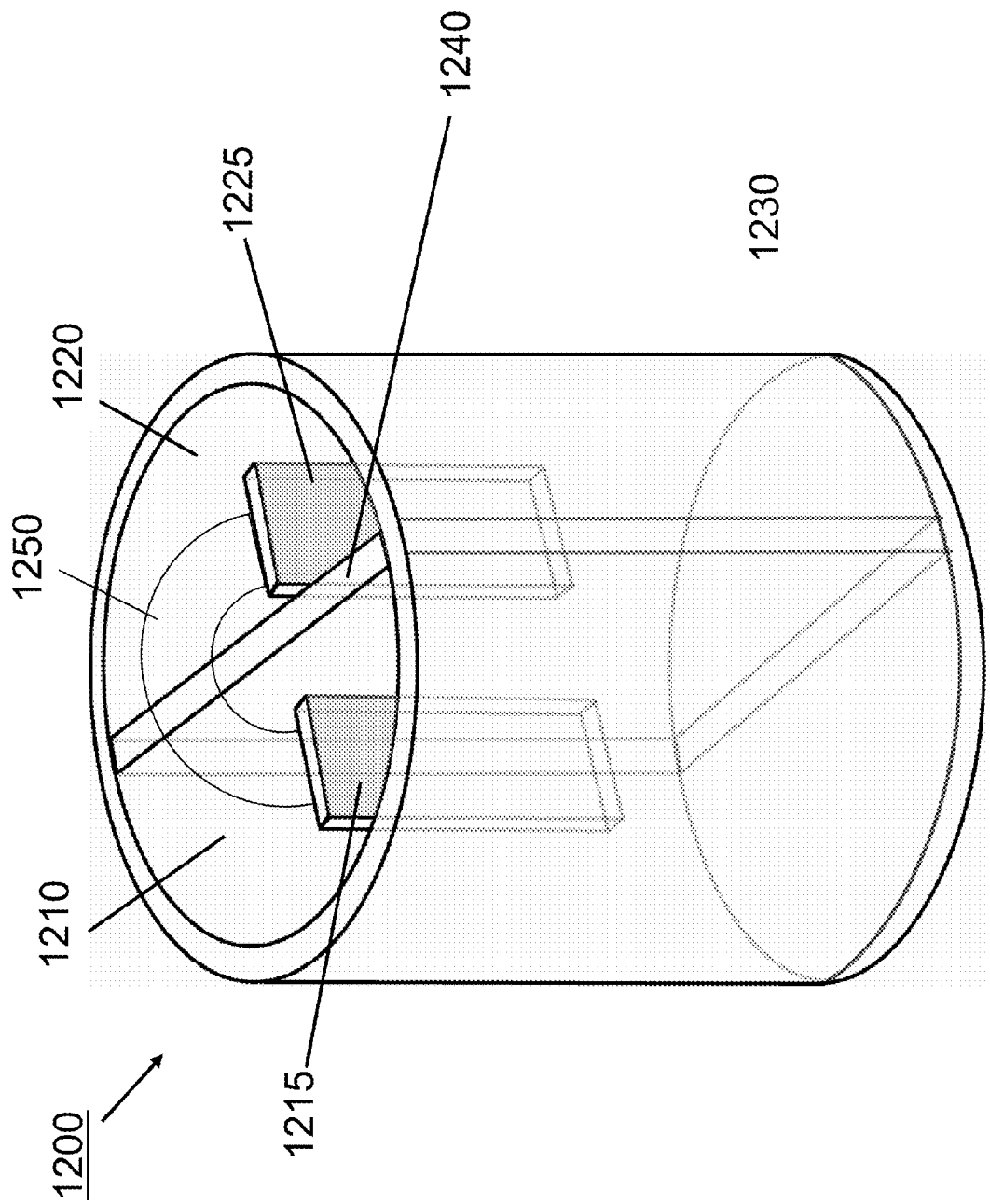

HETERO-NANOSTRUCTURES FOR SOLAR ENERGY CONVERSIONS AND METHODS OF FABRICATING SAME

RELATED APPLICATIONS

This application claims the benefit of and priority to U.S. Provisional Application Ser. No. 61/091,570, filed Aug. 25, 2008, and U.S. Provisional Application Ser. No. 61/119,470, filed Dec. 3, 2008, the entirety of these applications are hereby incorporated herein by reference.

FIELD

The embodiments disclosed herein relate to hetero-nanostructures for efficient solar energy conversions, and more particularly to the fabrication of titanium dioxide hetero-nanostructures and methods of using same for water splitting.

BACKGROUND

Enormous efforts have been recently attracted to seek new materials and/or novel structures for efficient solar energy conversions owing to the increasing awareness of devastating environmental impact of fossil fuel usages in meeting energy needs. To be economically competitive, solar energy needs to be converted into other forms that can be directly utilized with high efficiency and low cost. Among the materials that have been studied, titanium dioxide ($TiO_2$) is particularly appealing, owing to the fact that $TiO_2$ has a high incident photon-to-electrical charge conversion efficiency (IPCE), and remarkable chemical stability. Both photovoltaic and photoelectrochemical cells (PECs) based on $TiO_2$ have been investigated in recent years. Although different in the forms of conversion products, these processes share the same scientific concepts. In brief, photons are absorbed to separate charges, which are then either directly collected (for photovoltaics) or utilized to perform chemical reactions (for solar fuels).

The implementations of $TiO_2$ in solar conversions remain limited. The performance of $TiO_2$-based devices is compromised by several fundamental deficiencies of $TiO_2$, including: low conductivity, poor absorption in the visible range of the solar spectrum, and the lack of matching p-type materials.

SUMMARY

The embodiments disclosed herein relate to hetero-nanostructures for efficient solar energy conversions, and more particularly to the fabrication of titanium dioxide hetero-nanostructures and methods of using same for water splitting. According to aspects illustrated herein, there is provided a hetero-nanostructure that includes a plurality of connected and spaced-apart nanobeams linked together at an about 90-degree angle, the plurality of nanobeams including a conductive silicide core having an n-type photoactive titanium dioxide shell.

According to aspects illustrated herein, there is provided a hetero-nanostructure that includes an array of nanowires, wherein each nanowire in the array includes an n-type photoactive titanium dioxide shell over a p-type sulfide core.

According to aspects illustrated herein, there is provided a device for splitting water to generate hydrogen and oxygen that includes a first compartment two-dimensional hetero-nanostructure having a plurality of connected and spaced-apart nanobeams, each nanobeam substantially perpendicular to another nanobeam, the plurality of nanobeams including an n-type photoactive titanium dioxide shell and a highly conductive core; and a second compartment copper-doped titanium dioxide nanostructure, wherein the first compartment and the second compartment are separated by a semi-permeable membrane.

BRIEF DESCRIPTION OF THE DRAWINGS

The presently disclosed embodiments will be further explained with reference to the attached drawings, wherein like structures are referred to by like numerals throughout the several views. The drawings shown are not necessarily to scale, with emphasis instead generally being placed upon illustrating the principles of the presently disclosed embodiments.

FIG. 1A is a scanning electron micrograph (SEM) of the 2D conductive $TiSi_2$ nanostructure. The nanostructure is composed of a plurality of nanonet (NN) sheets. FIG. 1B is a transmission electron micrograph (TEM) showing a single NN of the 2D conductive $TiSi_2$ nanostructure. Each NN has a complex structure made up of nanobeams that are linked together by single crystalline junctions with 90° angles.

FIGS. 2A, 2B and 2C show high-resolution transmission electron micrographs (HRTEMs) of a single nanobeam highlighted from FIG. 1B. The entire nanobeam is single crystalline, including the joint (FIG. 2A), the middle (FIG. 2B) and the end (FIG. 2C).

FIGS. 3A and 3B are schematic representations of an illustrative embodiment of the charge transport within a core/shell hetero-nanostructure of the present disclosure. FIG. 3A shows charge pathways for the entire hetero-nanostructure. FIG. 3B shows detailed charge behaviors within one branch of the hetero-nanostructure.

FIG. 4A is a SEM (main frame) and TEM (inset) of the $TiO_2/TiSi_2$ hetero-nanostructures. FIG. 4B is a TEM revealing the core/shell nature of the $TiO_2/TiSi_2$ nanobeam. FIG. 4C is a HRTEM picture showing the atomic details of the $TiO_2/TiSi_2$ interface within the nanobeam. Top left inset: ED pattern confirms the anatase TiO2 structure; EDS insets (left: $TiO_2/TiSi_2$ and right: $TiO_2$) are different by the presence of Si on the left.

FIG. 6A shows I-V plots under different illumination conditions under a UV lamp that emitted at approximately 365 nm (2.65 mW/cm$^2$) and FIG. 6B shows the calculated efficiency.

FIG. 7A shows a schematic representation of an array of core/shell $TiO_2/Cu_2S$ nanowires. FIG. 7B is a SEM of an array of $Cu_2S$ nanowires used to fabricate a complex $TiO_2/Cu_2S$ hetero-nanostructure of the present disclosure, viewed from a perspective angle.

FIG. 8A shows a schematic representation of an array of multiwalled $TiO_2/Cu_2S$ nanotubes. FIG. 8B is a SEM of an array of Si nanowire arrays used to fabricate a complex $TiO_2/Cu_2S$ hetero-nanostructure of the present disclosure.

FIG. 9A shows X-ray diffraction (XRD) patterns. FIG. 9B shows an energy-dispersive X-ray spectrum (EDS). FIG. 9C shows X-ray photoelectron spectroscopy (XPS).

FIGS. 10A, 10B, 10C and 10D show photoelectrochemical properties of complex $W_{0.3}Ti_{0.7}O_2/TiSi_2$ hetero-nanostructures of the present disclosure. FIG. 10A shows current-potential plots in dark and in visible light. FIG. 10B shows calculated efficiency plot. FIG. 10C shows absorbance spectrum (inset) and optical band gap calculations. FIG. 10D shows x-ray diffraction patterns of anatase $TiO_2$ and $W$—$TiO_2$ for anatase peaks (101), left, and (200), right.

FIG. 12 shows an exemplary illustration of a device of the present disclosure for $H_2O$ splitting.

Figures 1A, 1B:
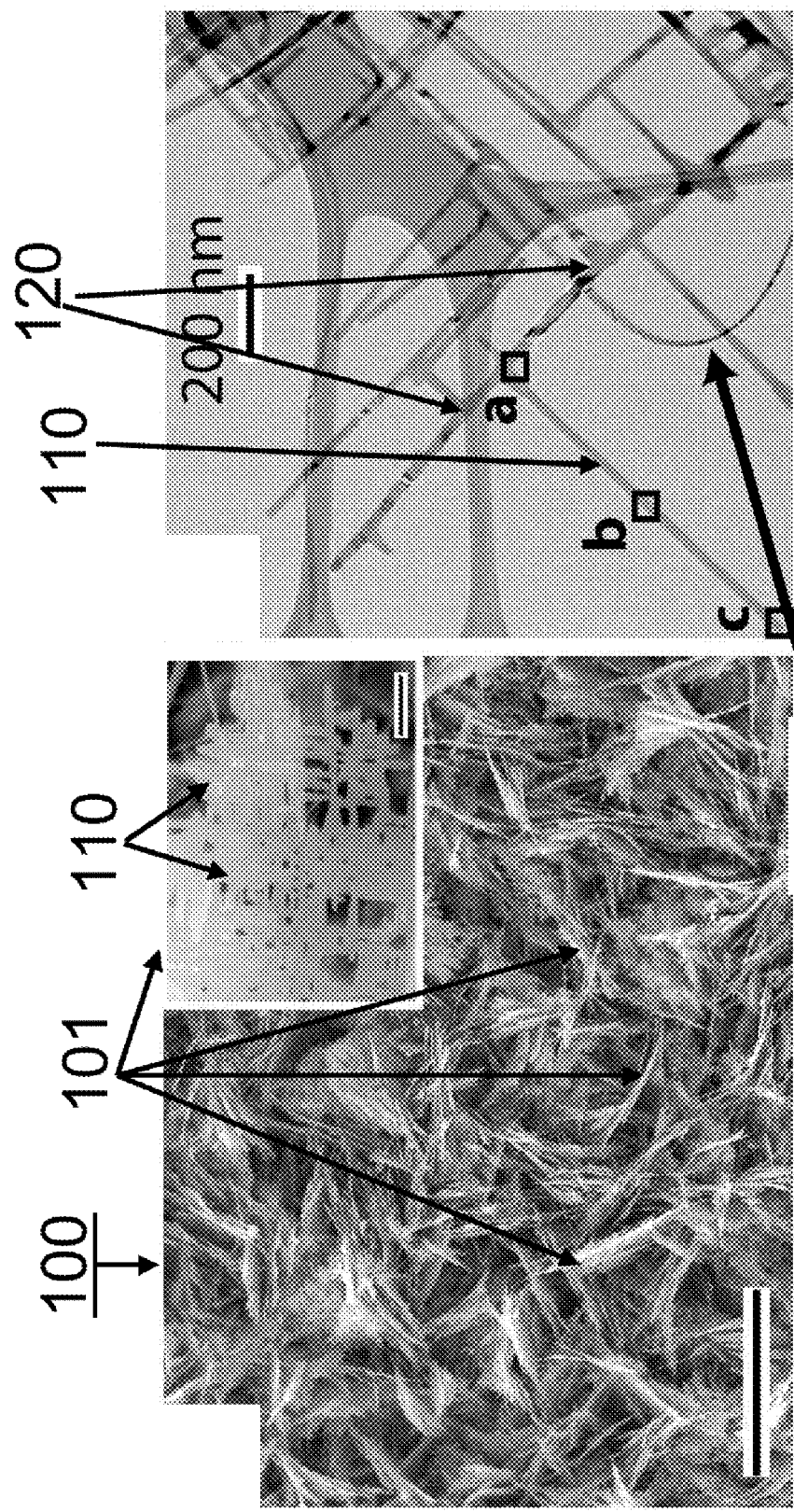
FIGS. 1A and 1B show electron micrographs of a 2D conductive titanium silicide ($TiSi_2$) nanostructure fabricated according to the methods of the presently disclosed embodiments.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

For solar hydrogen ($H_2$) generations, enhanced surface charge transfer to perform chemical reactions to split water ($H_2O$) is desirable. Compared with electricity, $H_2$ acts as an excellent energy carrier that can be stored for off-peak utilizations. Complete $H_2O$ photosplitting involves both $H_2$ and oxygen ($O_2$) generations, imposing opposite requirements on material properties. Ever since titanium dioxide ($TiO_2$) photocatalytic properties in splitting $H_2O$ was discovered, $TiO_2$ has attracted much attention for various photo energy conversions. The performance of $TiO_2$-based devices is compromised by several fundamental deficiencies of $TiO_2$. For example, photoactive anatase $TiO_2$ has a band gap of approximately 3.2 electron volt (eV), meaning that $TiO_2$ only absorbs in the UV range. Because of the wide band gap, as well as the low carrier densities, $TiO_2$ is a poor conductor, limiting $TiO_2$ capabilities in effectively collecting photo-generated electrons. In addition, $TiO_2$ lacks a complimentary p-type counterpart to complete the full $H_2O$ splitting cycle.

The hetero-nanostructures of the present disclosure tackle these deficiencies by combining $TiO_2$ with highly conductive nanostructures to improve conductivity; introducing or effective doping of low-band material to $TiO_2$ to enhance visible light absorption; and co-depositing cuprous sulfide ($Cu_2S$) and $TiO_2$ to synthesize p-type materials. The hetero-nanostructures of the present disclosure are useful for high efficiency solar energy conversions. In an embodiment, the hetero-nanostructures of the present disclosure are used as photoelectrochemical cells for $H_2$ production from $H_2O$ splitting by harvesting solar energy. In an embodiment, the hetero-nanostructures of the present disclosure are used as photovoltaic solar cells. In an embodiment, the hetero-nanostructures of the present disclosure are used as photocatalyst for pollutants treatments.

In an embodiment, hetero-nanostructures of the present disclosure combine highly conductive complex $TiSi_2$ nanonets (as a core) with photoactive $TiO_2$ coating (as a shell). In an embodiment, hetero-nanostructures of the present disclosure combine highly conductive complex $Cu_2S$ nanowires or nanotubes (as a core) with photoactive $TiO_2$ coating (as a shell). In an embodiment, hetero-nanostructures of the present disclosure combine highly conductive complex $TiSi_2$ nanonets (as a core) with photocatalyst-doped $TiO_2$ coating (as a shell).

Highly Conductive Complex Two-Dimensional Silicide Nanostructures—Fabrication of a Core Material for Hetero-Nanostructures of the Present Disclosure Silicides are highly conductive materials formed by alloying silicon with selected metals. Titanium silicide ($TiSi_2$) is an excellent electronic material and is one of the most conductive silicides (resistivity of about 10 micro-ohm-centimeters ($\mu\Omega \cdot cm$)). $TiSi_2$ has recently been demonstrated to behave as a good photocatalyst to split water by absorbing visible lights, a promising approach toward solar $H_2$ as clean energy carriers. Better charge transport offered by complex structures of nanometer-scaled $TiSi_2$ is desirable for nanoelectronics and solar energy harvesting. Capabilities to chemically synthesize $TiSi_2$ are therefore appealing. Synthetic conditions required by the two key features of complex nanostructures, low dimensionality and complexity, however, seem to contradict each other. Growth of one-dimensional (1D) features involves promoting additions of atoms or molecules in one direction while constraining those in all other directions, which is often achieved either by surface passivation to increase energies of sidewall deposition (such as solution phase synthesis) or introduction of impurity to lower energies of deposition for the selected directions (most notably the vapor-liquid-solid mechanism). Complex crystal structures, on the other hand, require controlled growth in more than one direction. The challenge in making two-dimensional (2D) complex nanostructures is even greater as it demands more stringent controls over the complexity to limit the overall structure within two dimensions. The successful chemical syntheses of complex nanostructures have been mainly limited to three-dimensional (3D) ones. In principle, 2D complex nanostructures are less likely to grow for crystals with high symmetries, e.g. cubic, since various equivalent directions tend to yield a 3D complex structure; or that with low symmetries, e.g. triclinic, monoclinic or trigonal, each crystal plane of which is so different that simultaneous growths for complexity are prohibitively difficult.

In an embodiment, a chemical vapor deposition (CVD) system is used for the fabrication of complex two-dimensional (2D) conductive silicide nanostructures of the presently disclosed embodiments. Various growth parameters, such as pressure, precursor ratios, temperatures and carrier gases, results in various silicide nanostructures. In an embodiment, the 2D conductive silicide nanostructures are titanium silicide ($TiSi_2$) nanonets. It should be noted that other 2D conductive silicide nanostructures can be fabricated using the methods of the presently disclosed embodiments, including, but not limited to, nickel silicide, iron silicide, platinum silicide, chromium silicide, cobalt silicide, molybdenum silicide and tantalum silicide. Methods of fabricating 2D conductive silicides include performing chemical vapor deposition, wherein one or more gas or liquid precursor materials carried by a carrier gas stream react to form a nanostructure having a mesh-like appearance and including a plurality of connected and spaced-apart nanobeams linked together at an about 90-degree angle.

A CVD system used for the fabrication of complex two-dimensional (2D) conductive silicide nanostructures of the presently disclosed embodiments can have, for example, automatic flow and pressure controls. Flow of a precursor gas and a carrier gas are controlled by mass flow controllers, and fed to a growth (reaction) chamber at precise flow rates. The flow rate for the precursor gas is between about 20 standard cubic centimeters per minute (sccm) and about 100 sccm. In an embodiment, the flow rate for the precursor gas is about 50 sccm. In an embodiment, the precursor gas is present at a concentration ranging from about $1.3 \times 10^{-6}$ mole/L to about $4.2 \times 10^{-6}$ mole/L. In an embodiment, the precursor gas is present at a concentration of about $2.8 \pm 1 \times 10^{-6}$ mole/L. The flow rate for the carrier gas is between about 80 standard cubic centimeters per minute (sccm) and about 130 sccm. In an embodiment, the flow rate for the carrier gas is about 100 sccm. A precursor liquid is stored in a cylinder and released to the carrier gas mass flow controller through a metered needle control valve. The flow rate for the precursor liquid is between about 1.2 sccm and 5 sccm. In an embodiment, the flow rate for the precursor liquid is about 2.5 sccm. In an embodiment, the precursor liquid is present at a concentration ranging from about $6.8 \times 10^{-7}$ mole/L to about $3.2 \times 10^{-6}$ mole/L. In an embodiment, the flow rate for the precursor liquid is present at a concentration of about $1.1 \pm 0.2 \times 10^{-6}$ mole/L. All precursors are mixed in a pre-mixing chamber prior to entering the reaction chamber. The pressure in the reaction chamber is automatically controlled and maintained approximately constant by the combination of a pressure transducer and a throttle valve. In an embodiment, the system is kept at a constant pressure of about 5 Torr during growth. The variation of the pressure during a typical growth is within 1% of a set point. All precursors are kept at room temperature before being introduced into the reaction chamber. A typical reaction lasts from about five minutes up to about twenty minutes. The reaction chamber is heated by a horizontal tubular furnace to temperature ranging from about 650° C. to about 685° C. In an embodiment, the reaction chamber is heated to a temperature of about 675° C.

In an embodiment, the precursor liquid is a titanium containing chemical. Examples of titanium containing chemicals include, but are not limited to, titanium beams from high temperature (or electromagnetically excited) metal targets, titanium tetrachloride ($TiCl_4$), and titanium-containing organometallic compounds. In an embodiment, the precursor gas is a silicon containing chemical. Examples of silicon containing chemicals include, but are not limited to, silane ($SiH_4$), silicon tetrachloride ($SiCl_4$), disilane ($Si_2H_6$), other silanes, and silicon beams by evaporation. In an embodiment, the carrier gas is selected from the group consisting of hydrogen (H), hydrochloric acid (HCl), hydrogen fluoride (HF), chlorine ($Cl_2$), fluorine ($F_2$), and an inert gas.

2D conductive $TiSi_2$ nanostructures disclosed herein are spontaneously fabricated in the CVD system when the precursors react and/or decompose on a substrate in the growth chamber. This spontaneous fabrication occurs via a seedless growth, i.e., no growth seeds are necessary for the growth of the 2D conductive $TiSi_2$ nanostructures. Therefore, impurities are not introduced into the resulting nanostructures. The fabrication method is simple, no complicated pre-treatments are necessary for the receiving substrates. The growth is not sensitive to surfaces (i.e., not substrate dependent). No inert chemical carriers are involved (the carrier gas also participates the reactions). The substrates that the disclosed nanostructures can be grown on are versatile, so long as the substrate sustains the temperatures required for the synthesis. In an embodiment, the 2D conductive $TiSi_2$ nanostructures are grown on a transparent substrate. It is believed that due to the nature of the synthesis of the 2D conductive $TiSi_2$ nanostructures disclosed herein, a continuous synthesis process may be developed to allow for roll-to-roll production.

FIG. 1A and FIG. 1B show electron micrographs of a complex 2D conductive $TiSi_2$ nanostructure 100 of the present disclosure fabricated as described above. FIG. 1A is a scanning electron micrograph (SEM) showing the complex nanostructure 100. The nanostructure 100 is composed of a plurality of 2D nanonet (NN) sheets 101. At relatively low magnifications, the nanostructure 100 packs to resemble tree leaves, except that each NN 101 is composed of nanobeams 110, as revealed by the close-up inset. (Scale bars: 5 µm in main frame, and 100 nm in the inset). The nanostructure 100 is better visualized under transmission electron microscope (TEM), as shown in FIG. 1B. Within each of the NN sheets 101 are approximately 25 nm wide and approximately 15 nm thick nanobeams 110, all linked together by single crystalline junctions 120 with about 90° angles. In an embodiment, the nanobeams 110 are substantially perpendicular to each other. One of the nanobeams 130 is twisted at the bottom of the picture, demonstrating belt-like characteristics. In an embodiment, the plurality of nanonet sheets are stacked approximately horizontally.

High resolution transmission electron microscopy (HR-TEM) images and electron diffraction (ED) patterns of different regions of the nanobeam 110 from FIG. 1B, reveal that the entire nanobeam 110 structure is single crystalline, including the 90° joints (FIG. 2A), the middle (FIG. 2B) and the ends (FIG. 2C). The ends of the nanobeams 110 within any NN 101, are free of impurities, FIG. 2C. The frames are nanobelts based on two main observations: loose ends often bend on TEM supporting films, showing characteristics of nanobeams (see 130 in FIG. 1B), and the thickness of the NN (approximately 15 nm) is thinner than the width of the NN (approximately 25 nm).

Titanium Dioxide-Based $H_2O$ Splitting Based on Core/Shell Hetero-Nanostructures of the Present Disclosure Complex core/shell hetero-nanostructures of the present disclosure which combine highly conductive two-dimensional (2D) complex nanonets with a photoactive coating offer outstanding charge transport among branches that are linked by single crystalline junctions. FIG. 3A and FIG. 3B summarize some of the advantages of the disclosed core/shell hetero-nanostructures, by presenting the charge pathway schematics, as indicated by the arrows in FIG. 3A and FIG. 3B. FIG. 3A shows a schematic representation of the charge pathways for an entire nanonets 300 of a hetero-nanostructure of the present disclosure, and FIG. 3B shows the detailed charge behaviors within one nanobeam 310 of the nanonets 300. Within the nanonets 300, charges are created at heterojunctions 320, and effectively moved away by the highly conductive cores 330. Detailed processes include charge separation, transport in cores 330 and shells 340, and recombination/reaction.

Silicide/Titanium Dioxide Hetero-Nanostructures

In an embodiment, the hetero-nanostructures of the present disclosure combine highly conductive complex $TiSi_2$ nanonets with photoactive $TiO_2$ coating (as termed herein, $TiO_2$/$TiSi_2$ hetero-nanostructures). $TiSi_2$ is one of the most conductive silicides (R ~10 µΩ·cm). In an embodiment, fabrication of complex $TiO_2$/$TiSi_2$ hetero-nanostructures of the present disclosure includes the growth of two-dimensional (2D) $TiSi_2$ nanonets by reacting $TiCl_4$ and $SiH_4$ in $H_2$ using CVD, as described above. In brief, 50 sccm $SiH_4$ (10% in He), 2 sccm $TiCl_4$ and 100 sccm $H_2$ are fed into the growth chamber simultaneously. The reaction typically takes place at 675° C.

The system is maintained at 5 Torr through out the growth, and growth occurs without growth seeds. Once produced, the $SiH_4$ feeding is stopped while the $TiCl_4$ and $H_2$ flow continued at 675° C. for 5 min. This treatment results in a thin Ti passivation layer that is important to the properties. The CVD system used to grow the highly conductive complex $TiSi_2$ nanonets of the present disclosure have automatic pressure and flow controls. In an embodiment, crystalline anatase $TiO_2$ shell is deposited around the 2D $TiSi_2$ nanonet using an atomic layer deposition (ALD) reactor with $Ti(i-PrO)_4$ as the precursor. In such a reaction, the reaction is performed at approximately 275° C. with a constant flow of $N_2$ flowing at about 20 sccm (base pressure ~500 mTorr). $Ti(i-PrO)_4$ (heated to about 75° C.) serves as the Ti precursor, and DI $H_2O$ at room temperature is used as the oxygen precursor. The pulse and purge time for $Ti(i-PrO)_4$ and $H_2O$ is about 0.1 s & 5 s, and 0.01 s & 10 s, respectively. In an embodiment, crystalline anatase $TiO_2$ shell is deposited around the 2D $TiSi_2$ nanonet using an atomic layer deposition (ALD) reactor with a Ti-containing volatile precursor. Examples of Ti-containing volatile precursors include, but are not limited to, $TiCl_4$. In an embodiment, crystalline anatase $TiO_2$ shell is deposited around the 2D $TiSi_2$ nanonet using a CVD. In an embodiment, crystalline anatase $TiO_2$ shell is deposited around the 2D $TiSi_2$ nanonet using sol-gel methods.

Figure 4C:
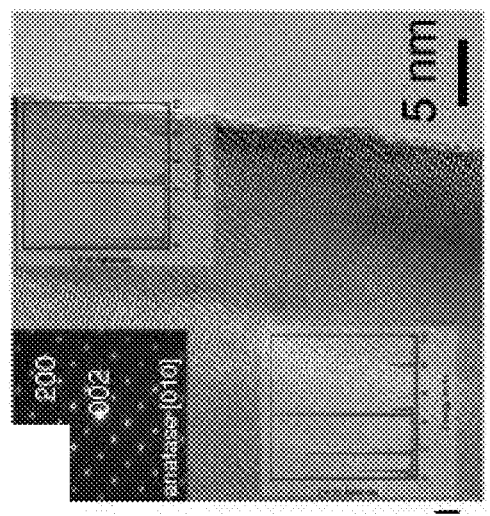
FIGS. 4A, 4B and 4C show an illustrative embodiment of a $TiO_2/TiSi_2$ hetero-nanostructures of the present disclosure.
Figure 4B:
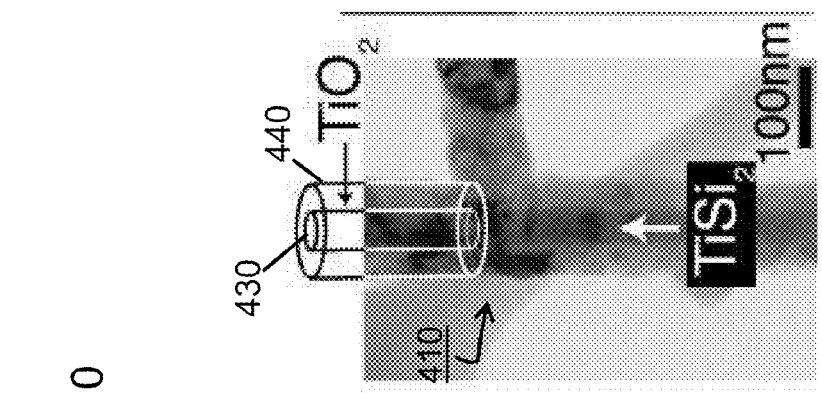
Figure 4A:
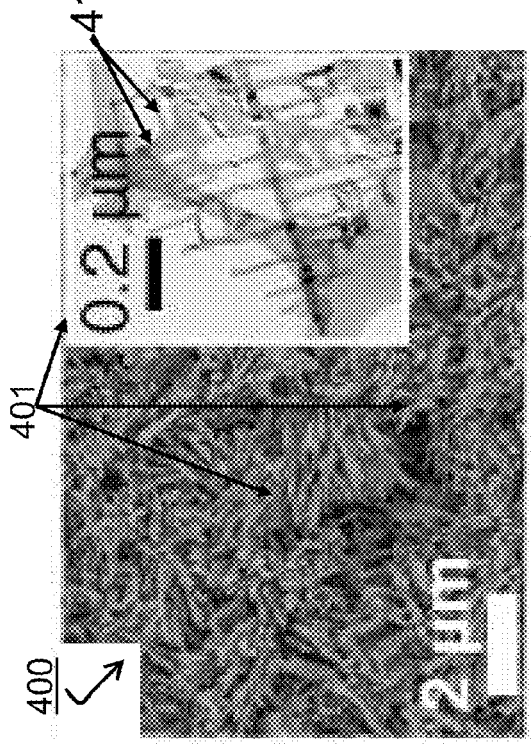

FIGS. 4A, 4B and 4C show electron micrographs of a complex $TiO_2/TiSi_2$ hetero-nanostructure 400 of the present disclosure fabricated as described above. FIG. 4A is a scanning electron micrograph (main frame) and transmission electron micrograph (inset) showing the complex hetero-nanostructure 400. The nanostructure 400 is composed of a plurality of 2D nanonet (NN) sheets 401. At relatively low magnifications, the hetero-nanostructure 400 packs to resemble tree leaves, except that each NN sheet 401 is composed of nanobeams 410, as revealed by the close-up inset. The nanobeams 410 are better visualized under transmission electron microscope (TEM), as shown in FIG. 4B. FIG. 4B shows the core/shell structure of the nanobeam 410 within the $TiO_2/TiSi_2$ hetero-nanostructure 400. The core 430 of the nanobeam 410 is $TiSi_2$, and the shell 440 is $TiO_2$. FIG. 4C is a HRTEM picture showing the atomic details of the $TiO_2/TiSi_2$ interfaces. Top left inset: ED pattern confirms the anatase TiO2 structure; EDS insets (left: $TiO_2/TiSi_2$ and right: $TiO_2$) are different by the presence of Si on the left. As described above, during the fabrication of $TiSi_2$ nanonets, the $SiH_4$ feeding is stopped while the $TiCl_4$ and $H_2$ flow are continued, resulting in a thin Ti passivation layer. The thin Ti passivation layer is later oxidized and converted into $TiO_2$, thus preventing the formation of $SiO_2$. Without the Ti passivation layer, both $TiO_2$ and $SiO_2$ form on the surface due to oxidation. The formation of $SiO_2$ might hinder efficient charge transfer from $TiO_2$ to $TiSi_2$.

Figure 5B:
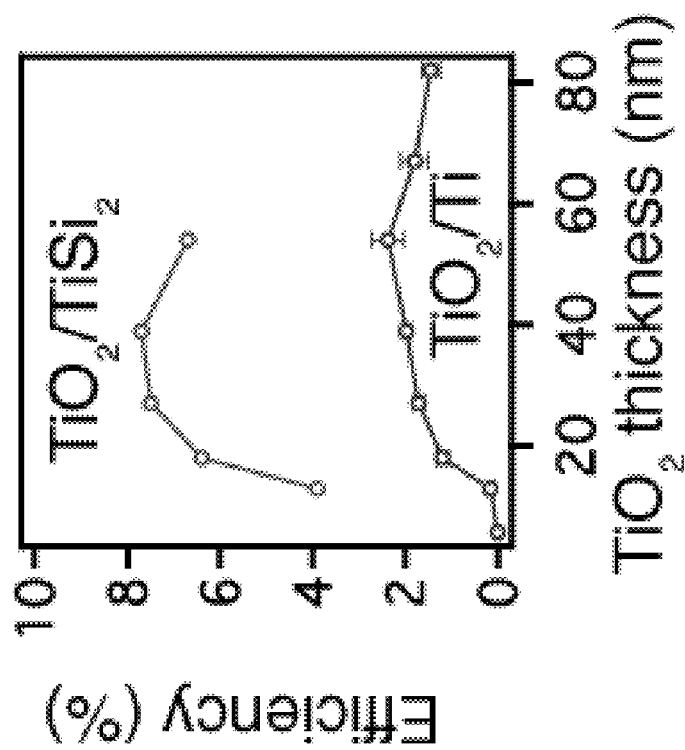
FIGS. 5A and 5B show electrochemistry of $TiO_2/TiSi_2$ hetero-nanostructures of the present disclosure. By incorporating highly conductive $TiSi_2$ with $TiO_2$, efficiencies in photocleavages of $H_2O$ using UV light is significantly enhanced.
Figure 5A:
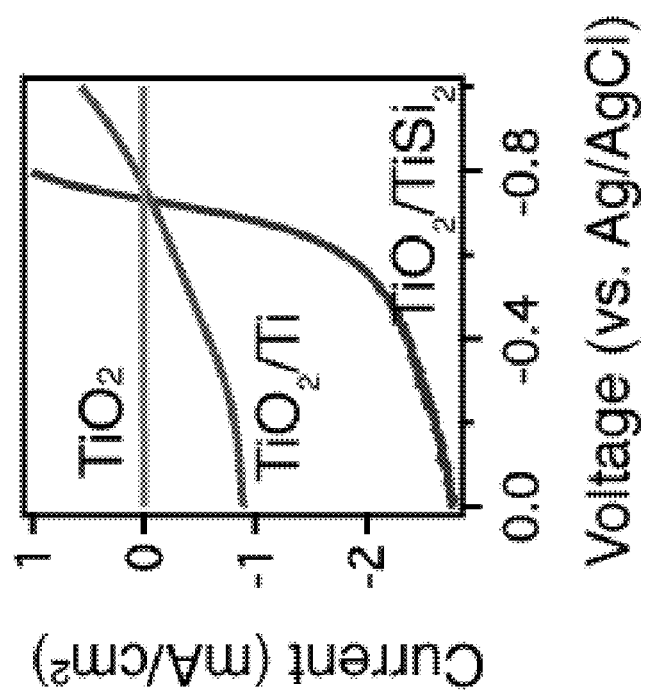

The thickness of the $TiO_2$ coating on the $TiSi_2$ nanostructures of the present disclosure can be chosen for optimal light absorption. In an embodiment, the thickness of the $TiO_2$ coating on the $TiSi_2$ nanostructures of the present disclosure ranges from about 25 nm to about 35 nm. In an embodiment, a thicker $TiO_2$ coating favors more light absorption, but can lead to poorer charge separation due to low conductivities. To balance these two factors, it is desirable to have a $TiO_2$ close to the length of its depletion width from the solid/liquid junctions. By incorporating highly conductive $TiSi_2$ in $TiO_2$, significantly enhanced efficiencies in photocleavages of $H_2O$ using UV light is observed, see FIG. 5A and FIG. 5B. The improvement primarily stems from increased conductivities. As shown in FIG. 5B, the optimum $TiO_2$ thickness is about 55 nm for a planar device (bottom line), compared to about 30 nm for a hetero-nanostructure of the present disclosure (top line), most likely a result of the maximized light absorption in the hetero-nanostructures of the present disclosure as a result of the hetero-nanostructures morphology. Therefore, the optimum $TiO_2$ thickness only represents the needed depletion width for incident photon induced charge separation. That is, the hetero-nanostructures of the present disclosure offer the opportunity to break the photo absorption and charge collection dilemma that is intrinsic to planar devices. Although a thick film is desired for enhanced photo absorptions, a thick film limits the charges that can be collected by both the reactions at the solid-liquid junction and the contact to the solid (i.e., the current to be measured). The $TiSi_2$ nanonets of the present disclosure provide efficient photo absorption (through the high surface area attained from the complex nature of the $TiSi_2$ nanonets) and enhanced charge transport (through the highly conductive $TiSi_2$ nanonets).

Figure 6B:
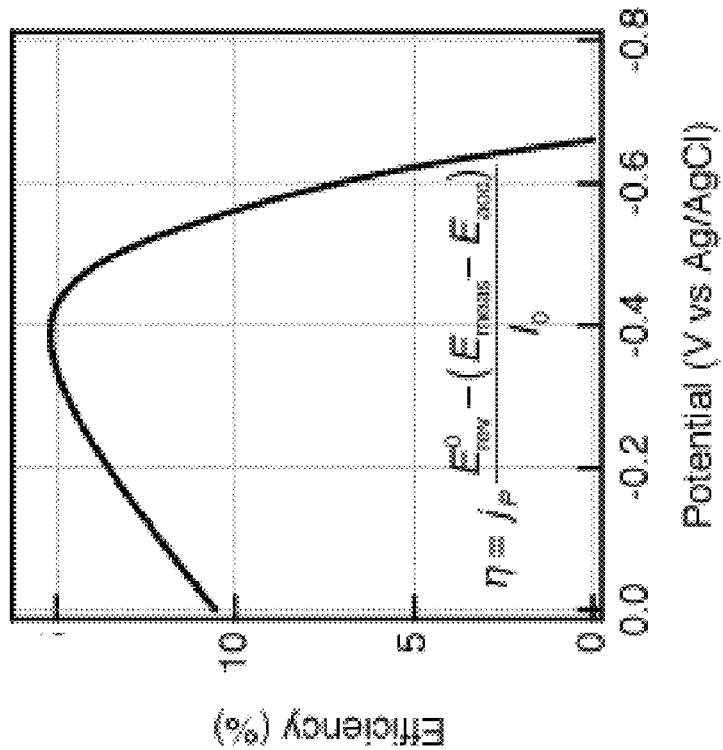
FIGS. 6A and 6B show photoelectrochemical properties of $TiO_2/TiSi_2$ hetero-nanostructures of the present disclosure.
Figure 6A:
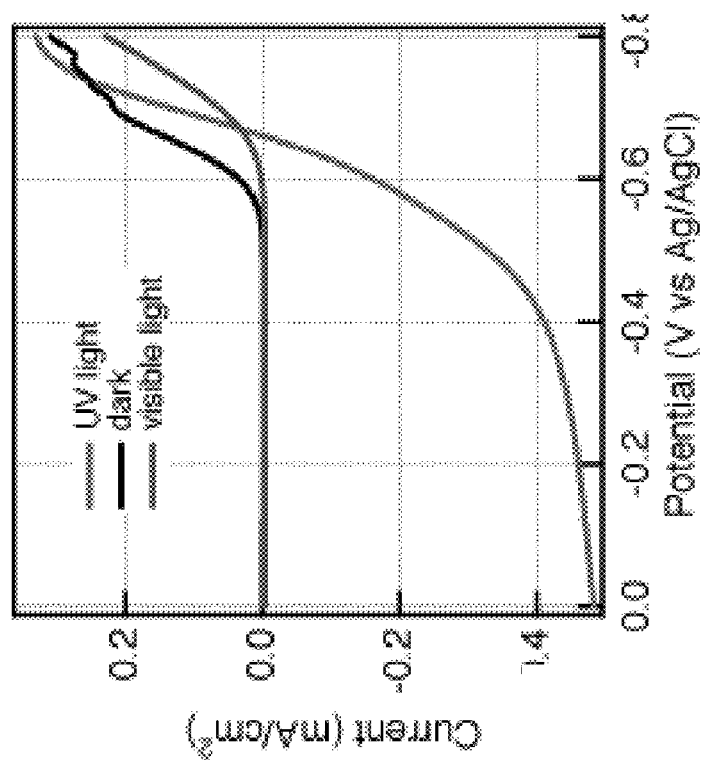

In an embodiment, the hetero-nanostructures of the present disclosure have photoelectrochemical properties. In an embodiment, a photoelectrochemical cell (PEC) is constructed from a $TiO_2/TiSi_2$ hetero-nanostructure of the present disclosure and measured in 0.05 M KOH electrolyte under illuminations of Xenon lamp (150 W, Oriel Apex illuminator) and 6 W handheld UV lamp that emits approximately 365 nm (UVGL-55 handheld UV lamp UVP), respectively. In an embodiment, a $TiO_2/TiSi_2$ hetero-nanostructure of the present disclosure is synthesized on a conductive Ti foil. An electric contact can be made by attaching a copper wire to the back side of the hetero-nanostructure sample with conductive silver epoxy (SPI). Then, the entire substrate, other than the front side with the hetero-nanostructure, can be covered by non-conductive hysol epoxy (Loctite). Measurements can be made using a CHI 600C Potentiostat/Galvanostat in a three-electrode configuration. For example, the $TiO_2/TiSi_2$ hetero-nanostructure on Ti foil serves as the working electrode, an Ag/AgCl in 3M KCl serves as the reference electrode, and a Pt mesh serves as the counter electrode. As shown in FIG. 6A, when measured in dark, the current-potential (I-V) plots are highly rectified due to the band bending at the $TiO_2$/solution interface. FIG. 6B shows the efficiency under UV light calculated as a function of the measured potential. Under Xenon light illuminations with a 400 nm cut-off filter that only allows UV light to pass, a significant current (photocurrent) (−0.6 mA/cm² at zero measured potential) was also observed. Current polarity depends on the settings of the potentialstat, negative currents corresponding to anodic reactions. The current is compensated at about −0.66 V. A peak efficiency of 7.6% in filtered Xenon light (about 6.67 mW/cm²) is obtainable using the $TiO_2/TiSi_2$ hetero-nanostructure. When the light source is replaced by a UV lamp that emits at approximately 365 nm (about 2.65 mW/cm²), a higher figure-of-merit (about 15.2%) is obtained.

Sulfide/Titanium Dioxide Hetero-Nanostructures

In an embodiment, the hetero-nanostructures of the present disclosure combine highly conductive complex cuprous (copper) sulfide ($Cu_2S$) nanowires or nanotubes with photoactive $TiO_2$ coating (as termed herein, $TiO_2/Cu_2S$ hetero-nanostructures). Photoactive anatase $TiO_2$ has a band gap of approximately 3.2-3.4 eV, absorbing nearly no visible light (1.7-3.1 eV). As most of the energy from solar radiation at the surface of the earth falls in the visible range, extending optical absorption in this range is important. At least two avenues can lead to this goal: incorporating materials with band gap less than 3 eV (i.e. >400 nm in wavelength), and altering $TiO_2$ band structures by introducing states in its band gap (through doping).

$Cu_2S$ (~2 eV bandgap) is chosen from candidates that absorb strongly in the visible range because both Cu and S are abundant on earth, and $Cu_2S$ is also unlikely to cause immediate environmental hazards. Moreover, $Cu_2S$ is reported as a p-type semiconductor, ideal to pair with $TiO_2$ (n-type) for solar cells. $TiO_2/Cu_2S$ hetero-nanostructures of the present disclosure can be synthesized to enhance visible light absorption, and the properties of the $TiO_2/Cu_2S$ hetero-nanostructures can be measured in photovoltaic and photoelectrochemical cells.

Figure 7B:
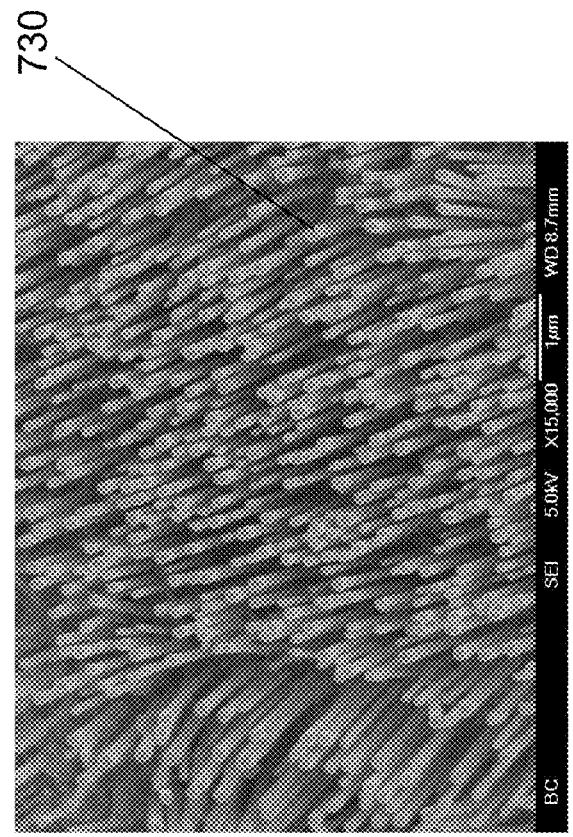
FIGS. 7A and 7B are illustrative embodiments of a complex $TiO_2/Cu_2S$ hetero-nanostructure of the present disclosure.
Figure 7A:
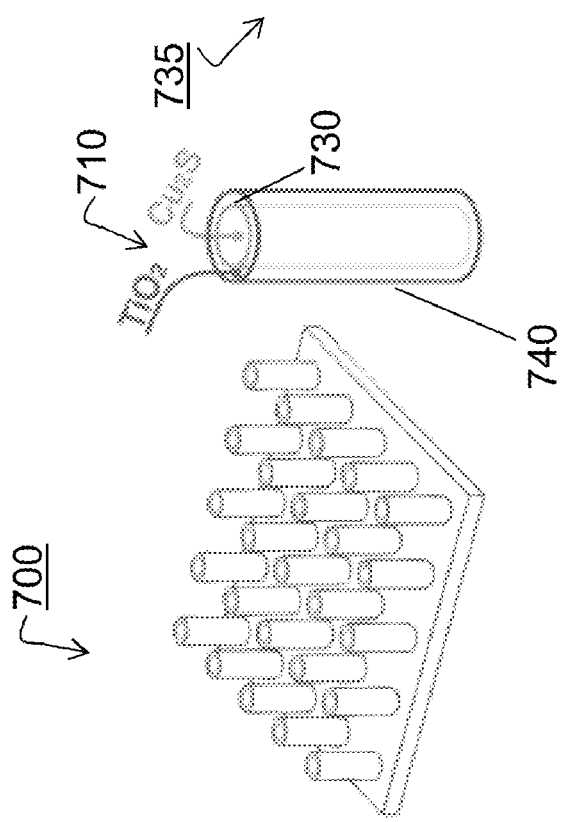

As shown in the schematic illustration of FIG. 7A, in an embodiment, an array of $TiO_2/Cu_2S$ hetero-nanostructures 700 of the present disclosure are fabricated by first synthesizing $Cu_2S$ nanowires 730 or complex nanostructures. $Cu_2S$ nanostructures 730 may be synthesized by reacting Cu in $H_2S$, with the presence of $O_2$, under atmospheric pressure. Seedless growth leads to vertically-aligned $Cu_2S$ nanowire arrays 735 (as shown in the SEM picture of FIG. 7B). Utilizing readily available chemical precursors, including gases such as $N_2$, $O_2$, $H_2O$ and $H_2S$, high quality $Cu_2S$ nanowires with controlled length can be synthesized. Important parameters in the synthesis process includes Cu surface treatments, the ratio of $O_2$ to $H_2S$ and the presence of $H_2O$ in the system. In an embodiment, polished Cu {001} surfaces favor nanowire growth. In an embodiment, crystalline anatase $TiO_2$ shell is deposited around the $Cu_2S$ nanowires using an atomic layer deposition (ALD) reactor with $Ti(i-PrO)_4$ as the precursor. In such a reaction, the reaction is performed at approximately 275° C. with a constant flow of $N_2$ flowing at about 20 sccm (base pressure 500 mTorr). $Ti(i-PrO)_4$ (heated to about 75° C.) serves as the Ti precursor, and DI $H_2O$ at room temperature is used as the oxygen precursor. The pulse and purge time for $Ti(i-PrO)_4$ and $H_2O$ is about 0.1 s & 5 s, and 0.01 s & 10 s, respectively. In an embodiment, crystalline anatase $TiO_2$ shell is deposited around the $Cu_2S$ nanowires using an atomic layer deposition (ALD) reactor with a Ti-containing volatile precursor. Examples of Ti-containing volatile precursors include, but are not limited to, $TiCl_4$. In an embodiment, crystalline anatase $TiO_2$ shell is deposited around the $Cu_2S$ nanowires using CVD. In an embodiment, crystalline anatase $TiO_2$ shell is deposited around the $Cu_2S$ nanowires using sol-gel methods.

Figure 8B:
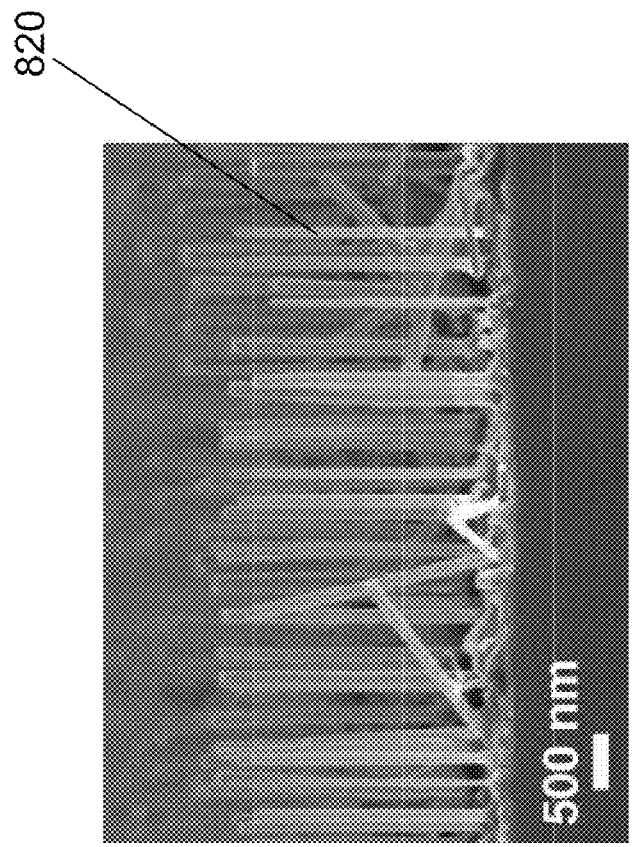
FIGS. 8A and 8B are illustrative embodiments of a complex $TiO_2/Cu_2S$ hetero-nanostructure of the present disclosure.
Figure 8A:
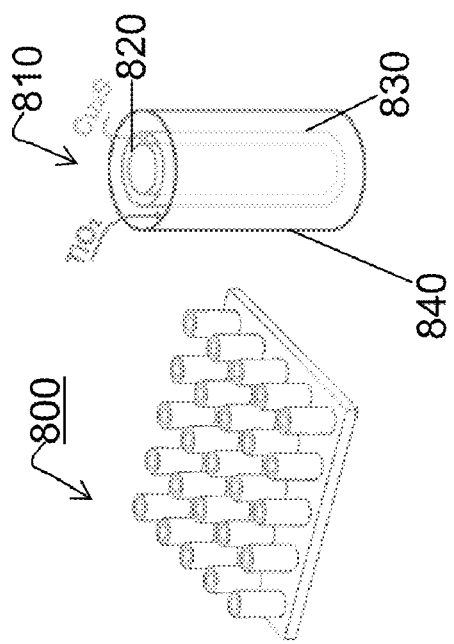

As shown in the schematic illustration of FIG. 8A, in an embodiment, an array of $TiO_2/Cu_2S$ hetero-nanostructures 800 of the present disclosure are fabricated by first growing $Cu_2S$ thin shells 830 on nanostructures 820 using ALD with $Cu(thd)_2$ (thd=tetramethylheptanedionate) and $H_2S$ as precursors, then depositing a shell 840 of $TiO_2$. In an embodiment, the nanostructures 820 are Si nanowires (as shown in FIG. 8B). In an embodiment, the nanostructure 820 are $TiSi_2$ nanostructures (as described above). $Cu_2S$ and $TiO_2$ can be grown subsequently in the ALD chamber without exposure to ambient air, thus to avoid impurities/contaminants at the interface and form high quality junctions. Nanostructure cores serve as an excellent conductor to transport split charges. The cores can also be removed using gas-phase etching to yield vertically-aligned nanotube arrays. After $Cu_2S$ and $TiO_2$ deposition, Si can be removed by reacting with $XeF_2$.

In the $TiO_2/Cu_2S$ hetero-nanostructures of the present disclosure, $TiO_2$ is provided as an outer shell layer because $TiO_2$ absorbs the UV range of the solar spectrum and is transparent to longer wavelength radiations, which will be subsequently absorbed by the inner walls or cores. This arrangement is also advantageous by only exposing chemically-stable $TiO_2$ to corrosive solutions.

The concept of co-deposition for doped $TiO_2$ nanostructures can be extended to visible light absorption enhancement as well. $TiO_2$ with dopants, such as N and S, can be obtained through in situ reactions with $NH_3$ and $H_2S$ co-flows, respectively. Other materials, e.g., $WO_3$, has been demonstrated to harness visible light for $H_2O$ splitting. In an embodiment, the hetero-nanostructures of the present disclosure combine highly conductive complex silicide or sulfide nanonets, nanowires or nanotubes with photocatalyst-doped $TiO_2$ coating, with the goal of achieving visible light absorption.

Figure 9C:
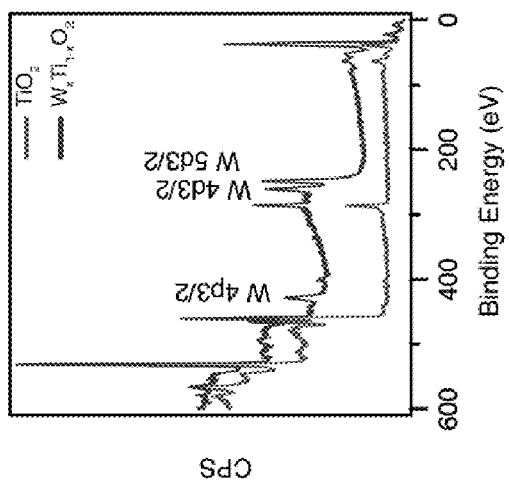
FIGS. 9A, 9B and 9C show the results of crystal structure studies and surface elemental analysis of $W_xTi_{1-x}O_2$, which is used to fabricate highly conductive complex silicide or sulfide nanonets, nanowires or nanotubes with photoactive-doped $TiO_2$ coatings of the present disclosure.
Figure 9B:
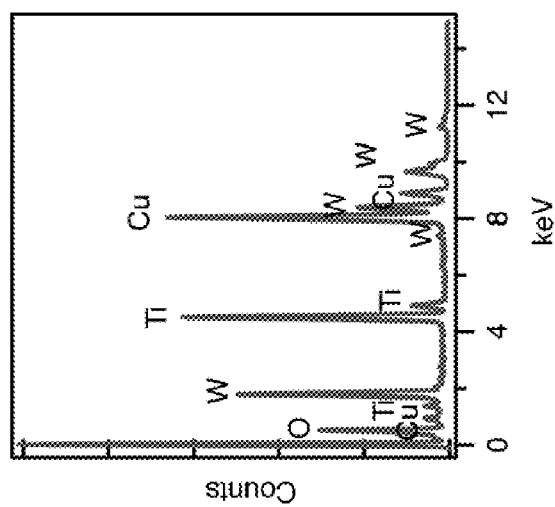
Figure 9A:
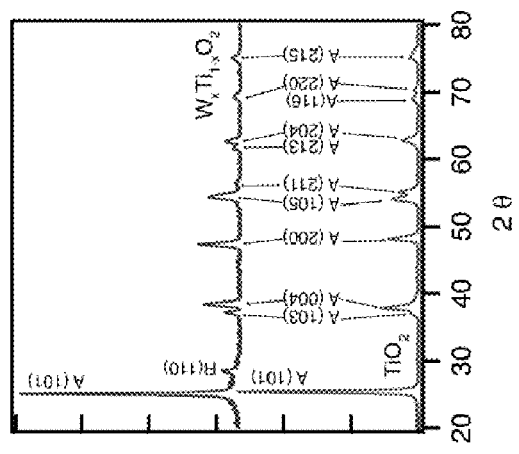

Tungsten (W) as $WO_3$ has been shown as a good photocatalyst that absorbs in the visible range. By introducing $(^tBuN)_2(Me_2N)_2W$ in the $TiO_2$ ALD growth sequences, $W_{0.3}Ti_{0.7}O_2$ can be successfully synthesized (see FIGS. 9A-C). X-ray diffraction patterns confirm the $TiO_2$ anatase structure. Both energy-dispersive X-ray spectrum (EDS) and X-ray photoelectron spectroscopy (XPS) revealed the W contents in the crystalline film (FIGS. 9A-C). As shown in FIG. 10C, the absorption in the visible range is significantly improved. The calculated optical bandgap is reduced from ~3.4 eV (red trace) to ~2.0 eV (blue trace). Corresponding photoelectrochemical measurements reveal improved photocurrent in the visible range with 400 nm cut-off filters, and the peak calculated efficiency is approximately 1.2% (FIG. 10A and FIG. 10B), better than that reported on C, or N doped $TiO_2$. Without being limited to any particular theory, the lattice distortion by the substitution of Ti with W (FIG. 10D) may play an important role in the properties alternations.

The $TiO_2/TiSi_2$ core/shell hetero-nanostructures of the present disclosure combine CVD and ALD methods. The network structure of the $TiSi_2$ nanonets of the present disclosure provide a structural support with high surface area to improve the photon absorptions of $TiO_2$. The high conductance of the $TiSi_2$ NN leads to high performance in photoelectrochemical measurements, with a peak efficiency of about 15% achievable under UV illuminations. By incorporating W into the $TiO_2$ shell to boost the visible light performance of $TiO_2$, a peak efficiency of 1.2% is obtainable.

p-Type $Cu_xTiO_2$ Nanostructures by Co-Deposition for $H_2$ Generations

Figure 11:
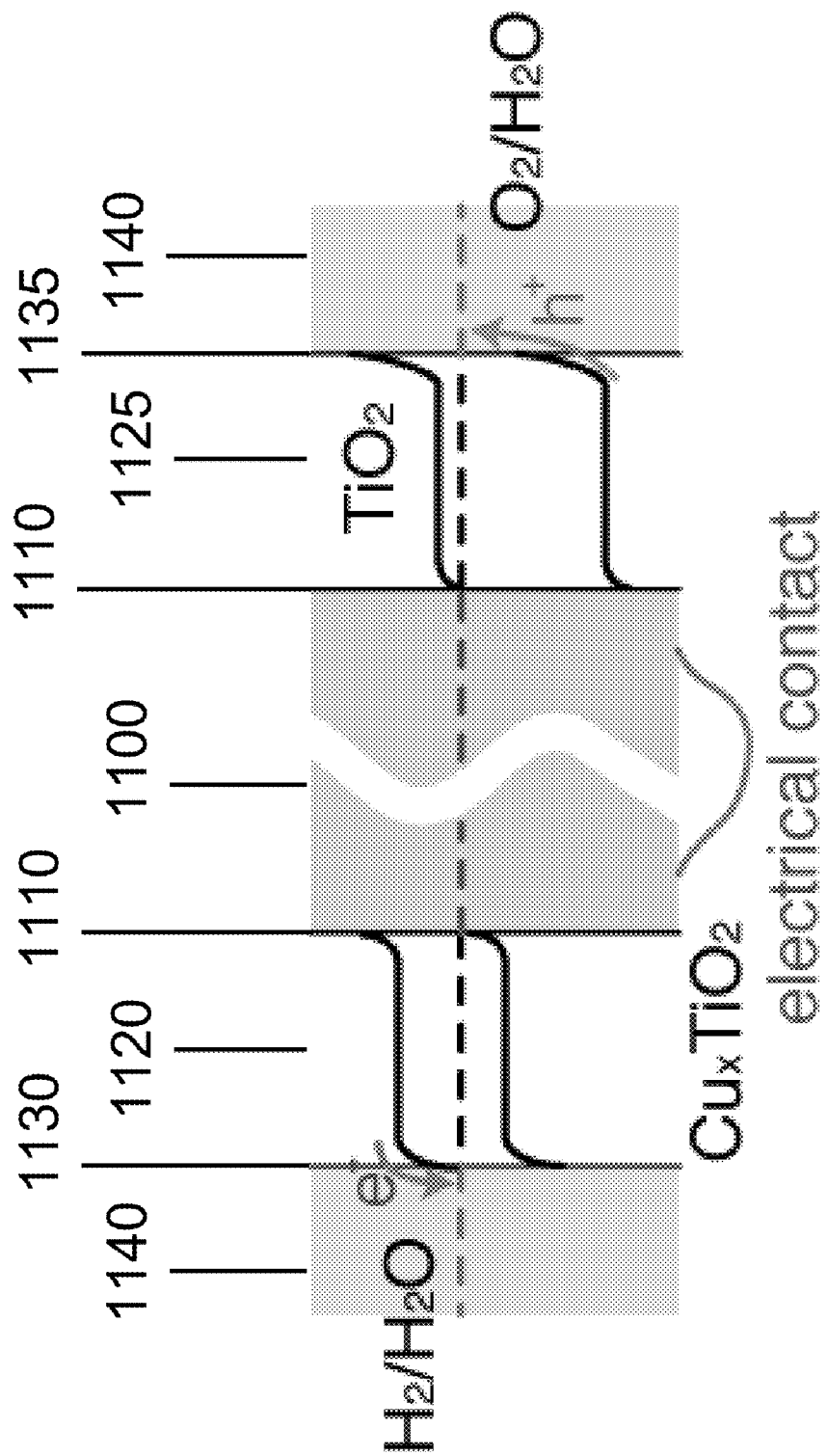
FIG. 11 is a schematic representation of an operating mechanism of $TiO_2$-based $H_2O$ splitting based on core/shell hetero-nanostructures of the presently disclosed embodiments.

Complete $H_2O$ photosplitting consists of $H_2$ and $O_2$ generations, imposing opposite requirements on material properties. For example, opposite band bending is expected for semiconductor/$H_2O$ interfaces for $H_2/H_2O$ and $O_2/H_2O$ reactions, respectively. The well-known z-scheme has been devised for this purpose, which also adds the advantage of utilizing different parts of the solar spectrum: blue regions being absorbed by wider band-gap materials for $O_2$ generations (n-type), and red regions for $H_2$ (by p-type materials). Implementations of this idea require both n- and p-type materials, which unfortunately cannot be met by intrinsic $TiO_2$ itself. Similar to many wide band-gap semiconductor oxides, $TiO_2$ is intrinsically doped by O vacancies, acting as an n-type material. This challenge can be circumvented by the introduction of complementary materials, such as Cu-doped $TiO_2$. Different from pure $TiO_2$, Cu-doped ones are p-type, therefore can be utilized for $H_2$ generations. By co-deposition in ALD growth, $Cu_xTiO_2$ can be synthesized. In an embodiment, $Cu(thd)_2$ precursors can be used. Compared with competing preparation methods such as the electrochemical etching of co-sputtered films, the ALD technique offers better film quality and more precise controls over chemical compositions. In an embodiment, $Cu_xTiO_2$ nanostructures are first grown on Ti foil for thin film characterizations, including structural analyses (XRD, Raman and XPS). Hetero-nanostructures can then be made on $TiSi_2$ nanostructures for photoelectrochemical measurements. The $Cu_xTiO_2$ nanostructure can be connected to $TiO_2/TiSi_2$ hetero-nanostructures of the present disclosure for complete $H_2O$ splitting.

p-Type $Cu_xTiO_2$ Nanostructures/$TiO_2$-Based Hetero-Nanostructures for Complete $H_2O$ Splitting FIG. 11 is a schematic representation of an operating mechanism of titanium dioxide ($TiO_2$)-based $H_2O$ splitting based on core/shell hetero-nanostructures of the presently disclosed embodiments. P-type materials 1120 (such as $Cu_x$-$TiO_2$ nanostructures of the present disclosure) are favorable for $H_2O$ reduction to produce $H_2$, as the corresponding band bending leads to easy electron transfer from the semiconductor to $H_2O$. Conversely, $O_2$ from $H_2O$ oxidation favors a $H_2O$/n-type material 1125 (such as $TiO_2$) interface for easy hole transfer. $O_2/H_2O$ and $H_2/H_2O$ redox potentials may be adjusted by changing the solution pH. The p-type 1120 and the n-type 1125 components are connected by highly conductive nanostructures 1100 (such as $TiSi_2$ or $Cu_2S$) for efficient charge transport. Upon contacting an electrolyte 1140, band bending forms at the junctions 1110, and extends to the rest of the coatings 1120 and 1125, also known as the depletion region. Charges ($e^-$ and $h^+$) created by incident photons are separated in the depletion regions. One type ($e^-$) is collected in the core 1100 and readily transported away, and the other type ($h^+$) is transferred to the electrolyte 1140 for chemical reactions. Some of the distinctive advantages offered by the core/shell hetero-nanostructures of the present disclosure include the $TiO_2$/electrolyte junction area 1130 and 1135 is maximized, and the charge transport is significantly improved by going through highly conductive core 1100 since charge transport no longer relies on $TiO_2$.

FIG. 12 shows an exemplary illustration of a device 1200 of the present disclosure for use in water splitting. The device 1200 includes two compartments, 1210 and 1220, each of which will be used for the half reactions of $H_2$ and $O_2$ generations. Solar energy is harnessed to separate charges, which then transfer to the redox pairs in the solutions to perform reactions. The appropriate energy alignment will be enabled by material choices (p-type for $H_2$ and n-type for $O_2$) and the adjustment of solution pH. Highly conductive components (such as $TiSi_2$) ensure efficient charge transport, thus completing the full reaction of $H_2O$ splitting. In an embodiment, compartment 1210 is filled with an acidic solution, and compartment 1220 is filled with a basic solution. Compartments 1210 and 1220 are separated by a semi-permeable membrane 1240 that only allows ionic exchange to balance potential buildup. In an embodiment, the semi-permeable membrane 1240 is a charge-mosaic membrane (CMM). In the acidic compartment 1210, hetero-nanostructures 1215 of the present disclosure with p-type coating act to produce $H_2$ upon illuminations. Examples of hetero-nanostructures 1215 of the present disclosure with p-type coating that can be used include, for example, $Cu_xTiO_2$ nanostructures/$TiO_2$-Based hetero-nanostructures. In the basic compartment 1220, hetero-nanostructures 1225 of the present disclosure with n-type coating act to produce $O_2$ upon illuminations. Examples of hetero-nanostructures 1225 of the present disclosure with n-type coating that can be used include, for example, titanium dioxide-based core/shell hetero-nanostructures. The supporting conductive substrates 1215 and 1225 are connected together by external contacts 1250 to ensure charge balance. In the solution, opposite charges flow through the semi-permeable membrane 1240 to annihilate each other. Both the acidic and the basic solutions should be periodically refreshed by adding more acids or bases to maintain an appropriate chemical potential difference by maintaining a preset PH difference.

Through co-deposition in ALD growth, p-type $Cu_xTiO_2$ nanostructures of the present disclosure are fabricated. $Cu(thd)_2$ (thd=tetramethylheptanedionate) precursors can be used, for example. Compared with competing preparation methods such as the electrochemical etching of co-sputtered films, the ALD technique offers better film quality and more precise controls over chemical compositions. As a bottom-up approach, it is also amenable to scaling up. $Cu_xTiO_2$ is first grown on Ti foil for thin film characterizations, including structural analyses (XRD, Raman and XPS). Hetero-nanostructures are then made on $TiSi_2$ nanostructures of the present disclosure for photoelectrochemical measurements.

Materials selected to interface with $TiO_2$ should not only provide superior conductance, thus carrying away collected electrons once illuminated, but also improve (at least maintain) the surface-to-volume ratio for good light absorption and chemical reactions. Such requirements demand materials that are in the nanoscale (for high surface area), are electrically connected (for efficient charge transport), and are intrinsically conductive. Furthermore, the material should only absorb light to a limited extent, leaving most of the optical energy to $TiO_2$. Interfacing materials include, but are not limited to, vertically-aligned metal nanowires, unaligned metal nanowires, nanonets, porous carbon, like those used in Li ion battery anodes, heavily doped Si nanostructures, silicides of titanium ($TiSi_2$), cobalt ($CoSi_2$), and nickel (NiSi), and sulfides, such as copper sulfide ($Cu_2S$). The lowest resistivity of Si one can achieve is around 1 mΩ·cm, about 10 times higher than that of $TiSi_2$. The interfacing materials to be used should not have a significant mismatch with $TiO_2$ in terms of electron energy levels (Fermi level). Otherwise, a significant barrier would be created, thereby lowering the efficiency. In an embodiment, the interfacing material is $TiO_2$. In an embodiment, the interfacing material is $Cu_2S$.

The choices of photoactive shells that can be used are limited by the physical and chemical properties. The shell should be able to absorb solar light, excite and separate electrons and transfer the separated charges (electrons or holes) to the solution to create $H_2$ (or $O_2$). For example, photoactive shells that can be used in the hetero-nanostructures of the present disclosure include, but are not limited to, $TiO_2$, $Ru(bpy)_3^{3+}$, where bpy stands for 2,2'-bipyridyl, GaAs, valent oxides such as $WO_3$, $Fe_2O_3$, and many others. In an embodiment, the shell is $TiO_2$.

A method of fabricating a titanium-dioxide core/shell hetero-nanostructure includes performing chemical vapor deposition so as to fabricate a two-dimensional conductive silicide, wherein one or more gas or liquid precursor materials carried by a carrier gas stream react to form a nanostructure having a mesh-like appearance and including a plurality of connected and spaced-apart nanobeams linked together at an about 90-degree angle; and performing atomic layer deposition so as to deposit a conformal crystalline anatase titanium-dioxide film around the nanostructure, wherein one or more gas or liquid precursor materials carried by a carrier gas stream react to form the hetero-nanostructure. In an embodiment, the conductive silicide is a titanium silicide. In an embodiment, the one or more gas or liquid precursor materials of the chemical vapor deposition is selected from a titanium containing chemical and a silicon containing chemical. In an embodiment, the carrier gas of the chemical vapor deposition is selected from the group consisting of H, HCl, HF, $Cl_2$, and $F_2$. In an embodiment, the one or more gas or liquid precursor materials of the atomic layer deposition is selected from a titanium containing chemical such as $Ti(i-PrO)_4$.

All patents, patent applications, and published references cited herein are hereby incorporated by reference in their entirety. It will be appreciated that several of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. A hetero-nanostructure comprising a plurality of connected and spaced-apart nanobeams linked together at an about 90-degree angle, the plurality of nanobeams including a conductive silicide core having an n-type photoactive titanium dioxide shell.

2. The hetero-nanostructure of claim 1 wherein the conductive silicide core is a titanium silicide core.

3. The hetero-nanostructure of claim 1 wherein the n-type photoactive titanium dioxide shell includes a dopant to absorb visible light.

4. The hetero-nanostructure of claim 1 wherein the plurality of nanobeams are two-dimensional.

5. The hetero-nanostructure of claim 1 wherein the hetero-nanostructure is used as a photoelectrochemical cell.

6. The hetero-nanostructure of claim 1 wherein the hetero-nanostructure is used as a solar cell.

7. The hetero-nanostructure of claim 1 for use in producing hydrogen.

8. A hetero-nanostructure comprising an array of nanowires, wherein each nanowire in the array includes an n-type photoactive titanium dioxide shell over a p-type cuprous sulfide core.

9. The hetero-nanostructure of claim 8 wherein the n-type photoactive titanium dioxide shell includes a dopant so as to achieve visible light absorption.

10. The hetero-nanostructure of claim 8 wherein the hetero-nanostructure is used as a photoelectrochemical cell.

11. The hetero-nanostructure of claim 8 wherein the hetero-nanostructure is used as a solar cell.

12. The hetero-nanostructure of claim 8 for use in producing hydrogen.

13. A hetero-nanostructure comprising an array of nanowires, wherein each nanowire in the array includes an n-type photoactive titanium dioxide shell over a p-type sulfide core, wherein the n-type photoactive titanium dioxide shell includes a dopant so as to achieve visible light absorption.

14. A device for splitting water to generate hydrogen and oxygen comprising:
 a first compartment two-dimensional hetero-nanostructure having a plurality of connected and spaced-apart nanobeams, each nanobeam substantially perpendicular to another nanobeam, the plurality of nanobeams including an n-type photoactive titanium dioxide shell and a highly conductive core; and
 a second compartment copper-doped titanium dioxide nanostructure,
 wherein the first compartment and the second compartment are separated by a semi-permeable membrane.

15. The device of claim 14 wherein the highly conductive core is a titanium silicide core.

16. The device of claim 14 wherein the highly conductive core is a cuprous sulfide core.

17. The device of claim 14 wherein the n-type photoactive titanium dioxide shell includes a dopant to absorb visible light.

18. The device of claim 17 wherein the dopant includes tungsten.

19. The device of claim 14 wherein a thickness of the n-type photoactive titanium dioxide shell ranges from about 25 nm to about 35 nm.

20. The device of claim 14 wherein the first compartment includes an acidic solution and the second compartment includes a basic solution.

* * * * *